US012787437B2

(12) United States Patent
Jung et al.

(10) Patent No.: US 12,787,437 B2
(45) Date of Patent: Nov. 3, 2026

(54) DISPLAY MODULE, DISPLAY APPARATUS AND METHOD FOR MANUFACTURING SAME

(71) Applicant: SAMSUNG ELECTRONICS CO., LTD., Suwon-si (KR)

(72) Inventors: Youngki Jung, Suwon-si (KR); Chulgyu Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 565 days.

(21) Appl. No.: 18/227,162

(22) Filed: Jul. 27, 2023

(65) Prior Publication Data

US 2023/0387144 A1 Nov. 30, 2023

Related U.S. Application Data

(63) Continuation of application No. PCT/KR2022/004369, filed on Mar. 29, 2022.

(30) Foreign Application Priority Data

Apr. 23, 2021 (KR) ........................ 10-2021-0053022

(51) Int. Cl.
*H10D 86/60* (2025.01)
*H10D 86/40* (2025.01)
(Continued)

(52) U.S. Cl.
CPC ........... *H10D 86/60* (2025.01); *H10D 86/441* (2025.01); *H10D 86/451* (2025.01);
(Continued)

(58) Field of Classification Search
None
See application file for complete search history.

(56) References Cited

U.S. PATENT DOCUMENTS 8,107,005 B2 * 1/2012 Lee ........................ H04N 23/54 348/374
10,276,640 B2 4/2019 Chung et al.
(Continued)

FOREIGN PATENT DOCUMENTS

CN 105633124 B * 8/2018 ........... H10K 59/122
CN 110012136 A 7/2019
(Continued)

OTHER PUBLICATIONS

Office Action issued Jan. 22, 2025 by the Korean Intellectual Property Office for Korean Patent Application No. 10-2021-0053022.
(Continued)

*Primary Examiner* — Michael Lebentritt
(74) *Attorney, Agent, or Firm* — Sughrue Mion, PLLC

(57) ABSTRACT

A display module includes: a plurality of pixels arranged in two dimensions; a display panel including: a back plate including: a transparent substrate; a pixel circuit layer; and a plurality of power electrode layers provided on the transparent substrate; and a plurality of inorganic light emitting elements provided on the back plate; and an image sensor provided on the rear of the display panel, wherein each of the plurality of pixels includes two or more inorganic light emitting elements among the plurality of inorganic light emitting elements, the display panel includes a plurality of transparent regions in a region corresponding to a position of the image sensor, and each transparent region of the plurality of transparent regions is configured to allow external light to be incident on the image sensor.

15 Claims, 21 Drawing Sheets

(51) Int. Cl.
*H10H 20/855* (2025.01)
*H10W 72/90* (2026.01)
*H10W 90/00* (2026.01)

(52) U.S. Cl.
CPC .......... *H10H 20/855* (2025.01); *H10W 90/00* (2026.01); *H10W 72/90* (2026.01); *H10W 72/934* (2026.01); *H10W 72/944* (2026.01); *H10W 90/792* (2026.01); *H10W 90/794* (2026.01)

(56) References Cited

U.S. PATENT DOCUMENTS

| | | | |
|---|---|---|---|
| 10,579,854 B2 | 3/2020 | Choo et al. | |
| 10,620,745 B2 | 4/2020 | He et al. | |
| 10,768,356 B1 | 9/2020 | Zhang et al. | |
| 11,375,129 B2 | 6/2022 | Ou et al. | |
| 11,552,231 B2 | 1/2023 | Kim | |
| 2011/0304532 A1 | 12/2011 | Suh et al. | |
| 2016/0154170 A1* | 6/2016 | Thompson | F21V 33/00 362/555 |
| 2017/0142360 A1 | 5/2017 | Goto et al. | |
| 2017/0287992 A1 | 10/2017 | Kwak et al. | |
| 2019/0149687 A1 | 5/2019 | Chang et al. | |
| 2019/0157337 A1 | 5/2019 | Lin et al. | |
| 2020/0083283 A1* | 3/2020 | Lee | H01L 25/0753 |
| 2020/0211443 A1 | 7/2020 | Zeng et al. | |
| 2020/0320267 A1 | 10/2020 | Zhang et al. | |
| 2020/0357776 A1* | 11/2020 | Nielsen | H10H 20/855 |
| 2022/0013597 A1 | 1/2022 | Liu et al. | |
| 2022/0109036 A1* | 4/2022 | Jeong | H10K 59/1213 |

FOREIGN PATENT DOCUMENTS

| | | | | |
|---|---|---|---|---|
| CN | 110491909 A | | 11/2019 | |
| CN | 111381414 A | | 7/2020 | |
| CN | 111725267 A | | 9/2020 | |
| CN | 112071888 A | | 12/2020 | |
| CN | 217588931 U | * | 10/2022 | |
| CN | 119546064 A | * | 2/2025 | H10K 59/1213 |
| DE | 102017128453 A1 | * | 5/2018 | G06F 3/0412 |
| KR | 102017-0029041 A | | 3/2017 | |
| KR | 10-1725044 B1 | | 4/2017 | |
| KR | 10-2017-0111827 A | | 10/2017 | |
| KR | 10-2017-0119032 A | | 10/2017 | |
| KR | 10-2018-0061474 A | | 6/2018 | |
| KR | 20180065736 A | * | 6/2018 | B32B 27/36 |
| KR | 10-2019-0012195 A | | 2/2019 | |
| KR | 10-2019-0012970 A | | 2/2019 | |
| KR | 10-2019-0028245 A | | 3/2019 | |
| KR | 20190120051 A | * | 10/2019 | H01L 27/3244 |
| KR | 20190134361 A | * | 12/2019 | G02F 1/1333 |

OTHER PUBLICATIONS

Written Opinion (PCT/ISA/237) issued Aug. 1, 2022 by the International Searching Authority in International Application No. PCT/KR2022/004369.

International Search Report (PCT/ISA/210) issued Aug. 1, 2022 by the International Searching Authority in International Application No. PCT/KR2022/004369.

* cited by examiner

DISPLAY MODULE, DISPLAY APPARATUS AND METHOD FOR MANUFACTURING SAME

CROSS-REFERENCE TO RELATED APPLICATION(S)

This application is a continuation of International Application No. PCT/KR2022/004369, filed on Mar. 29, 2022, in the Korean Intellectual Property Receiving Office, which is based on and claims priority to Korean Patent Application No. 10-2021-0053022, field on Apr. 23, 2021, in the Korean Intellectual Property Office, the disclosures of which are incorporated herein by reference in their entireties.

BACKGROUND

1. Field

The disclosure relates to a display module and display device for realizing an image using an inorganic light emitting element, and a manufacturing method thereof.

2. Description of Related Art

Display devices may be classified into a self-light emitting display in which each pixel emits light by itself and a light-receiving display in which a separate light source is required.

Because a liquid crystal display (LCD), which is a typical light-receiving display, requires a backlight unit to supply light from the rear of a display panel, a liquid crystal layer to act as a switch to pass/block light, and a color filter to convert the supplied light into a desired color, the LCD is structurally complex and has a limitation in realizing a thin thickness.

On the other hand, because a self-light-emitting display, in which a light emitting element is provided for each pixel such that each pixel emits light by itself, does not require components such as a backlight unit and a liquid crystal layer, and may not require the color filter, the self-light-emitting display is structurally simple and thus may have a high degree of design freedom. In addition, the self-light-emitting display may realize not only a thin thickness, but also an excellent contrast ratio, brightness and viewing angle.

Among the self-light-emitting displays, a micro-light-emitting diode (LED) display is one of flat panel displays and includes a plurality of LEDs with a size of about 100 micrometers. Compared to the LCD, which requires a backlight, the micro-LED display may offer an excellent contrast, response time and energy efficiency.

In addition, the micro LEDs, which are inorganic light emitting elements, are brighter, have higher light-emitting efficiency, and have longer lifespan than organic LEDs (OLEDs), which require a separate encapsulation layer to protect organic materials.

SUMMARY

Provided are a display module and display device capable of realizing an under display camera (UDC) function while maintaining a resolution.

Additional aspects will be set forth in part in the description which follows and, in part, will be apparent from the description, or may be learned by practice of the presented embodiments.

According to an aspect of the disclosure, a display module includes: a plurality of pixels arranged in two dimensions; a display panel including: a back plate including: a transparent substrate; a pixel circuit layer; and a plurality of power electrode layers provided on the transparent substrate; and a plurality of inorganic light emitting elements provided on the back plate; and an image sensor provided on the rear of the display panel, wherein each of the plurality of pixels includes two or more inorganic light emitting elements among the plurality of inorganic light emitting elements, the display panel includes a plurality of transparent regions in a region corresponding to a position of the image sensor, and each transparent region of the plurality of transparent regions is configured to allow external light to be incident on the image sensor, each transparent region of the plurality of transparent regions is provided between apertures of two or more pixels among the plurality of pixels, and each transparent region of the plurality of transparent regions includes a plurality of pinholes respectively provided in the plurality of power electrode layers and overlapping in one direction.

The display panel may further include a black matrix layer provided on the back plate and configured to block light in a region other than a region corresponding to an aperture of each of the plurality of pixels, and each transparent region of the plurality of transparent regions may further include a pinhole in the black matrix layer overlapping the pinhole of each of the plurality of power electrode layers in one direction.

Each of the plurality of transparent regions may be in a region in which a pixel circuit on the pixel circuit layer is not positioned.

Each transparent region of the plurality of transparent regions may be in a region in which signal wires on the pixel circuit layer are not positioned.

The display module may further include: a driver integrated circuit (IC) configured to transmit a driving signal to a pixel circuit of the pixel circuit layer; and a flexible printed circuit board (FPCB) on which the driver IC is provided and electrically connected to a rear surface of the back plate, and each of the plurality of transparent regions may be in a region in which the FPCB is not positioned.

The plurality of transparent regions may have substantially the same diameter.

The plurality of transparent regions may include at least one first transparent region having a first diameter and at least one second transparent region having a second diameter that is different from the first diameter.

The plurality of transparent regions may include: at least one first transparent region having a first diameter; at least one second transparent region having a second diameter larger than the first diameter; and at least one third transparent region having a third diameter smaller than the first diameter.

The plurality of transparent regions may include at least one first transparent region having a first diameter and at least one second transparent region having a second diameter that is larger than the first diameter, and the at least one first transparent region may be provided on the display panel at a first position that is closer to a center of the region corresponding to the position of the image sensor than a second position corresponding to the at least one second transparent region.

The plurality of transparent regions may include at least one first transparent region having a first diameter and at least one second transparent region having a second diameter that is larger than the first diameter, and the at least one second transparent region may be provided on the display panel at a first position that is closer to a center of the region corresponding to the position of the image sensor than a second position corresponding to the at least one first transparent region.

Each transparent region of the plurality of transparent regions may have a diameter that is different from at least one respective adjacent transparent region of the plurality of transparent regions.

The image sensor may be configured to obtain image data by detecting external light incident through the plurality of transparent regions.

According to an aspect of the disclosure, a display device includes: a plurality of display modules including a plurality of pixels arranged in two dimensions; and a frame configured to support the plurality of display modules, wherein at least one of the plurality of display modules includes: a display panel including: a back plate including: a transparent substrate; a pixel circuit layer; and a plurality of power electrode layers provided on the transparent substrate; and a plurality of inorganic light emitting elements provided on the back plate; and an image sensor provided on the rear of the display panel, each of the plurality of pixels may include two or more inorganic light emitting elements among the plurality of inorganic light emitting elements, the display panel may include a plurality of transparent regions in a region corresponding to a position of the image sensor, and each transparent region of the plurality of transparent regions is configured to allow external light to be incident on the image sensor, each transparent region of the plurality of transparent regions is provided between apertures of two or more pixels among the plurality of pixels, and each transparent region of the plurality of transparent regions may include a plurality of pinholes respectively provided in the plurality of power electrode layers and overlapping in one direction.

The display panel further may include a black matrix layer provided on the back plate and configured to block light in a region other than a region corresponding to an aperture of each of the plurality of pixels, and each transparent region of the plurality of transparent regions may include a pinhole in the black matrix layer overlapping the pinhole of each of the plurality of power electrode layers in one direction.

Each transparent region of the plurality of transparent regions may be in a region in which a pixel circuit on the pixel circuit layer is not positioned.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
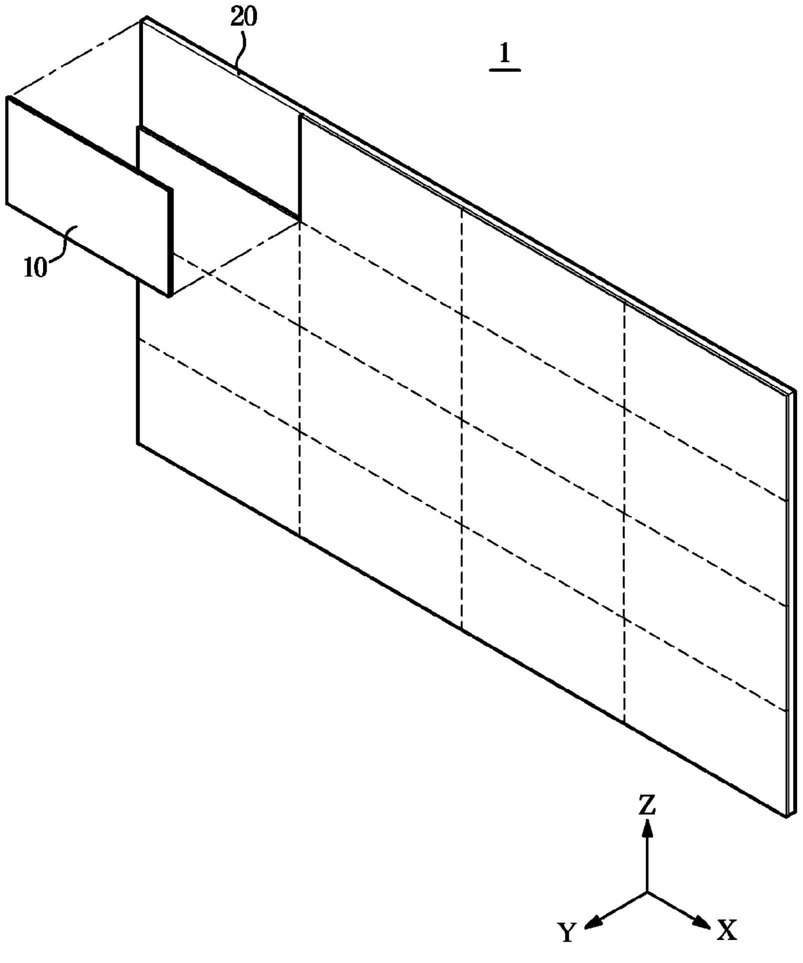
FIG. 1 is a perspective view illustrating an example of a display module and a display device including the display module according to an embodiment of the present disclosure.

The embodiments described in the present specification and the configurations shown in the drawings are only examples of preferred embodiments of the present disclosure, and various modifications may be made at the time of filing of the present disclosure to replace the embodiments and drawings of the present specification.

Throughout the specification, when a part is referred to as being “connected” to another part, it includes not only a direct connection but also an indirect connection, and the indirect connection includes connecting through a wireless network.

The terms used herein are for the purpose of describing the embodiments and are not intended to restrict and/or to limit the present disclosure. For example, the singular expressions herein may include plural expressions, unless the context clearly dictates otherwise. Also, the terms “comprises," "includes," and "has" are intended to indicate that there are features, numbers, steps, operations, components, parts, or combinations thereof described in the specification, and do not exclude the presence or addition of one or more other features, numbers, steps, operations, components, parts, or combinations thereof.

It will be understood that, although the terms first, second, etc. may be used herein to describe various components, these components should not be limited by these terms. These terms are only used to distinguish one component from another. For example, without departing from the scope of the present disclosure, the first component may be referred to as a second component, and similarly, the second component may also be referred to as a first component.

Terms such as "~unit", "~part," "~block," "~member," "~module," and the like may denote a unit for processing at least one function or operation. For example, the terms may refer to at least one hardware such as a field-programmable gate array (FPGA)/an application specific integrated circuit (ASIC), at least one software stored in a memory, or at least one process processed by a processor.

In each step, an identification numeral is used for convenience of explanation, the identification numeral does not describe the order of the steps, and each step may be performed differently from the order specified unless the context clearly states a particular order.

Hereinafter, example embodiments of the disclosure will be described in detail with reference to the accompanying drawings. The same reference numerals are used for the same components in the drawings, and redundant descriptions thereof will be omitted. The embodiments described herein are example embodiments, and thus, the disclosure is not limited thereto and may be realized in various other forms.

Figure 2:
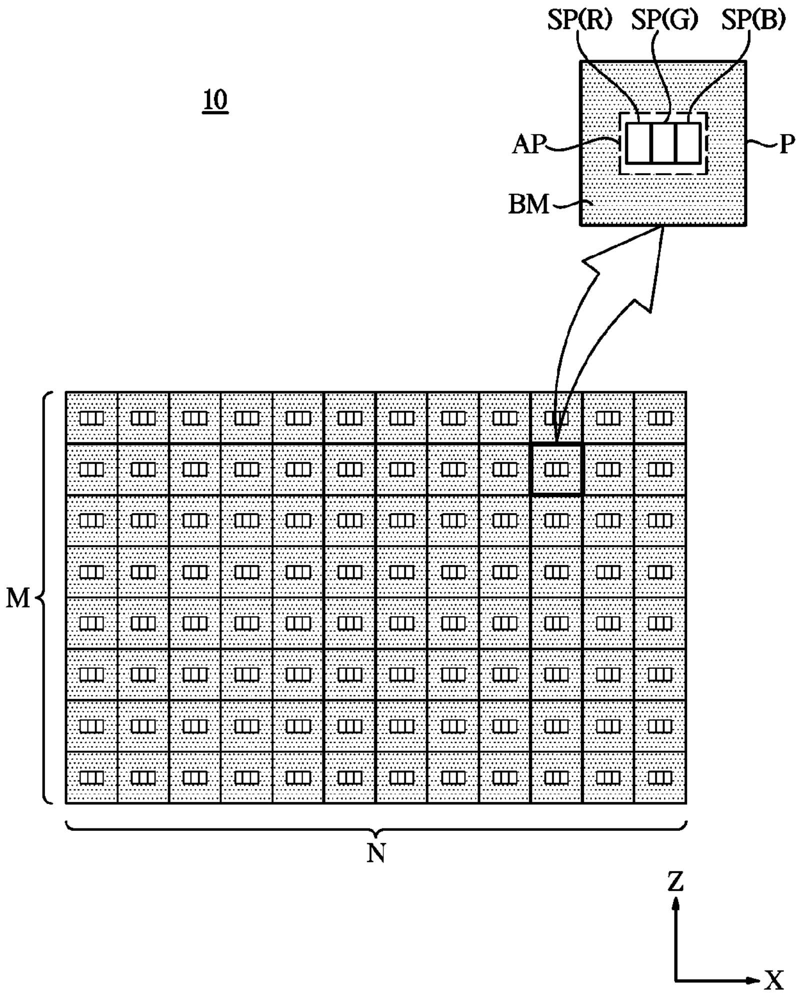
FIG. 2 is a diagram illustrating an example of a pixel arrangement constituting a unit module of the display device according to an embodiment of the present disclosure.

FIG. 1 is a perspective view illustrating an example of a display module and a display device including the display module according to an embodiment of the present disclosure. FIG. 2 is a diagram illustrating an example of a pixel arrangement constituting a unit module of the display device according to an embodiment of the present disclosure.

A display device 1 according to an embodiment is a self-light-emitting display device in which a light emitting element is disposed for each pixel such that each pixel may emit light by itself. Therefore, unlike a liquid crystal display (LCD) device, because components such as a backlight unit and a liquid crystal layer are not required, a thin thickness may be implemented, and various design changes are possible due to a simple structure.

The display device 1 according to an embodiment may employ an inorganic light emitting element such as an inorganic light emitting diode as a light emitting element disposed in each pixel. The inorganic light emitting element has a faster reaction rate than an organic light emitting element such as an organic light emitting diode (OLED), and may realize high luminance with low power.

In addition, unlike the organic light emitting element, which requires an encapsulation process and has low durability because it is vulnerable to exposure to moisture and oxygen, the inorganic light emitting element does not require the encapsulation process and has strong durability. Hereinafter, the inorganic light emitting element mentioned in an embodiment, which will be described later, refers to an inorganic light emitting diode.

The inorganic light emitting element employed in the display device 1 according to an embodiment may be a micro LED having a short side length of about 100 nm. As such, by employing the micro-unit LED, a pixel size may be reduced and high resolution may be implemented even within the same screen size.

In addition, when a LED chip is manufactured in a microscopic size, the issue of breaking when bent due to the characteristics of inorganic materials may be solved. That is, because a micro LED chip is not broken even if a flexible substrate is bent when the micro LED chip is transferred to the flexible substrate, a flexible display device may also be implemented.

A display device employing the micro LED may be applied to various fields using a subminiature pixel size and thin thickness. As an example, as illustrated in FIG. 1, a large screen may be implemented by tiling a plurality of display modules 10 on which a plurality of the micro LEDs is transferred and fixing the tiled display modules 10 to the housing 20, and a display device having such a large screen may be used as a signage, an electronic display board, and the like.

A three-dimensional coordinate system of X, Y, and Z axes illustrated in FIG. 1 is based on the display device 1, a plane on which a screen of the display device 1 is located is an XZ plane, and a direction in which an image is output or a light emitting direction of an inorganic light emitting element is a +Y direction. Because the coordinate system is based on the display device 1, the same coordinate system may be applied both when the display device 1 is lying down and standing upright.

Because generally, the display device 1 is used in an upright state and a user watches an image from the front of the display device 1, a +Y direction in which the image is output may be referred to as a forward direction, and an opposite direction may be referred to as a rearward direction.

Also, generally, the display device 1 is manufactured in a lying state. Therefore, a −Y direction of the display device 1 may be referred to as a downward direction, and the +Y direction may be referred to as an upward direction. That is, in an embodiment which will be described later, the +Y direction may be referred to as the upward direction or the forward direction, and the −Y direction may be referred to as the downward direction or the rearward direction.

Except for upper and lower surfaces of the display device 1 or the display module 10, which has a flat panel, the remaining four sides will all be referred to as side surfaces regardless of a posture of the display device 1 or the display module 10.

FIG. 1 illustrates a case in which the display device 1 implements a large screen by including a plurality of the display modules, but the embodiment of the display device 1 is not limited thereto. The display device 1 may be implemented as a TV, a wearable device, a portable device, a monitor for a PC, and the like by including the one display module 10.

Referring to FIG. 2, the display module 10 may include pixels P in an M×N array (M and N are two or more integers), that is, a plurality of the pixels P arranged in two dimensions. FIG. 2 conceptually illustrates a pixel arrangement, and each of the pixels P may include an aperture AP through which an inorganic light emitting element is positioned to emit light, and a black matrix BM to block light in a region other than the aperture AP.

In this embodiment, that certain components are arranged in two dimensions may include cases in which the corresponding components are disposed not only on the same plane but also on different planes parallel to each other. In addition, the case in which the corresponding components are disposed on the same plane does not necessarily have to be positioned on the same plane even at upper ends of the disposed components, and may also include a case in which the upper ends of the disposed components are positioned on different planes parallel to each other.

The unit pixel P may include at least three subpixels that emit light of different colors. For example, the unit pixel P may include three subpixels SP(R), SP(G), and SP(B) corresponding to R, G, and B, respectively. Herein, the red subpixel SP(R) may output red light, the green subpixel SP(G) may output green light, and the blue subpixel SP(B) may output blue light.

However, the pixel arrangement in FIG. 2 is only an example that may be applied to the display module 10 and the display device 1 according to an embodiment, the subpixels may be arranged along the Z-axis direction and may not be arranged in a line, and sizes of the subpixels may be implemented differently. A single pixel only needs to include a plurality of subpixels to implement a plurality of colors, and the size or arrangement of each subpixel is not limited.

In addition, the unit pixel P does not necessarily include the red subpixel SP(R) outputting red light, the green subpixel SP(G) outputting green light, and the blue subpixel SP(B) outputting blue light, and may include a subpixel outputting yellow light or white light. That is, a color or type of light output from each subpixel and the number of subpixels are not limited.

However, in an embodiment, which will be described later, for detailed description, a case in which the unit pixel P is composed of the red subpixel SP(R), the green subpixel SP(G), and the blue subpixel SP(B) will be described as an example.

As described above, the display module 10 and the display device 1 according to an embodiment are self-light-emitting display devices in which each pixel may emit light by itself. Accordingly, an inorganic light emitting element emitting light of different colors may be disposed in each subpixel. For example, a red inorganic light emitting element may be disposed in the red subpixel SP(R), a green inorganic light emitting element may be disposed in the green subpixel SP(G), and a blue inorganic light emitting element may be disposed in the blue subpixel SP(B).

Therefore, in this embodiment, the pixel P may represent a cluster including the red inorganic light emitting element, the green inorganic light emitting element, and the blue inorganic light emitting element, and the subpixels may represent the respective inorganic light emitting elements.

Figure 3:
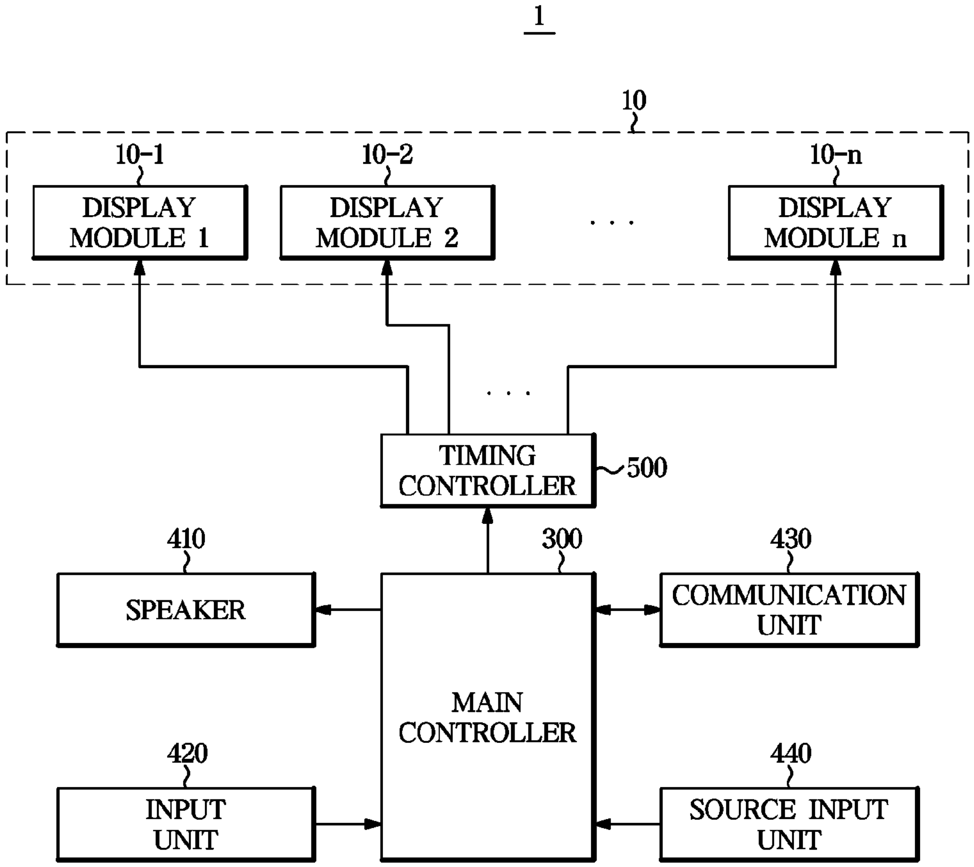
FIG. 3 is a diagram of the display device according to an embodiment of the present disclosure.

FIG. 3 is a diagram of the display device 1 according to an embodiment of the present disclosure.

As described above with reference to FIG. 1, the display device 1 according to an embodiment may include a plurality of display modules 10-1, 10-2, . . . , and **10-*n* (n is an integer of two or more), and may include a main controller 300 and a timing controller 500 configured to control the plurality of display modules 10, a communication unit 430 provided to communicate with an external device, a source input unit 440 provided to receive a source image, a speaker 410 provided to output sound, and an input unit 420 provided to receive a command for controlling the display device 1** from the user.

The input unit 420 may include a button or a touch pad provided in one region of the display device 1, and when a display panel 100 (see FIG. 4) is implemented as a touch screen, the input unit 420 may include a touch pad provided on a front surface of the display panel 100. The input unit 420 may also include a remote controller.

The input unit 420 may receive various commands for controlling the display device 1, such as power on/off of the display device 1, volume control, channel control, screen control, and various setting changes, from the user.

The speaker 410 may be provided in one region of the housing 20, and a separate speaker module physically separated from the housing 20 may be further provided.

The communication unit 430 may perform communicating with a relay server or other electronic device to exchange necessary data. The communication unit 430 may employ at least one of various wireless communication methods such as 3rd Generation (3G), 4th Generation (4G), wireless local area network (LAN), Wi-Fi, Bluetooth, ZigBee, Wi-Fi Direct (WFD), ultra-wide band (UWB), Infrared Data Association (IrDA), Bluetooth low energy (BLE), near field communication (NFC), and Z-Wave. Also, wired communication methods such as peripheral component interconnect (PCI), PCI-express, and universe serial bus (USB) may be employed.

The source input unit 440 may receive source signals input from a set top box, USB, antenna, and the like. Accordingly, the source input unit 440 may include at least one selected from a group of source input interfaces including a high definition multimedia interface (HDMI) cable port, a USB port, an antenna, and the like.

A source signal received by the source input unit 440 may be processed by the main controller 300 to be converted into a form capable of being output from the display panel 100 and the speaker 410.

The main controller 300 and the timing controller 500 may include at least one memory for storing a program and various data for performing an operation, which will be described later, and at least one processor for executing the stored program.

The main controller 300 may process a source signal input through the source input unit 440 to generate an image signal corresponding to the input source signal.

For example, the main controller 300 may include a source decoder, a scaler, an image enhancer, and a graphics processor. The source decoder may decode a source signal compressed in a format such as MPEG, and the scaler may output image data of a desired resolution through resolution conversion.

The image enhancer may improve the quality of image data by applying correction of various techniques. The graphics processor may classify pixels of image data into RGB data and output the data along with a control signal such as a syncing signal for display timing in the display panel 100. That is, the main controller 300 may output image data and a control signal corresponding to a source signal.

The operations of the main controller 300 described above are merely an example applicable to the display device 1, and other operations may be further performed or some of the above operations may be omitted.

The image data and the control signal output from the main controller 300 may be transferred to the timing controller 500.

The timing controller 500 may convert the image data transferred from the main controller 300 into image data in a form capable of being processed by a driver integrated circuit (IC) 200 (see FIG. 4), and may generate various control signals such as a timing control signal necessary to display the image data on the display panel 100.

Although the display device 1 according to an embodiment does not have to necessarily include the plurality of display modules 10, in an embodiment, which will be described later, the display device 1 including the plurality of display modules 10 will be described as an example for detailed description.

Figure 4:
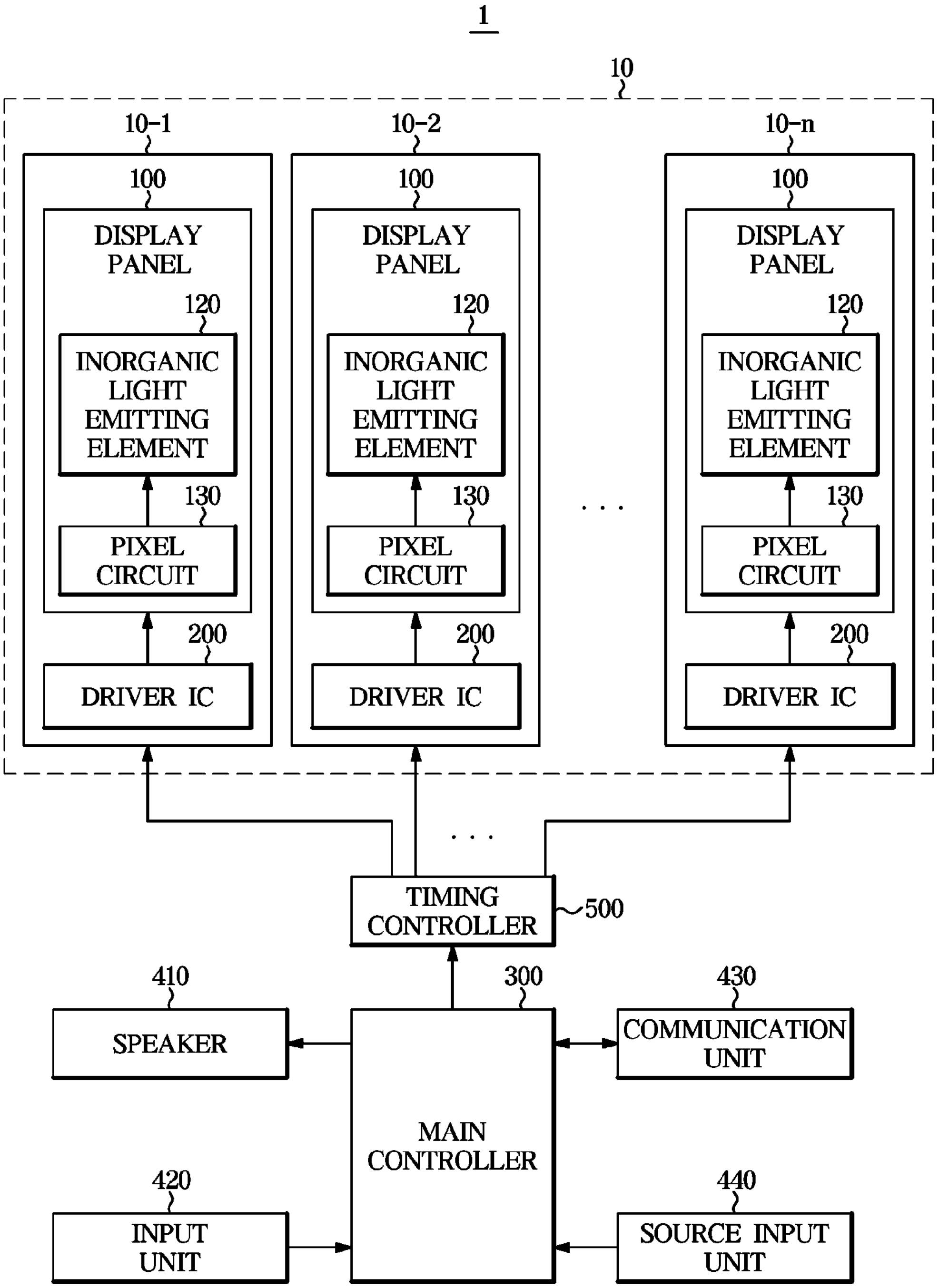
FIG. 4 is a diagram of a configuration of a display module included in the display device according to an embodiment of the present disclosure.
Figure 5:
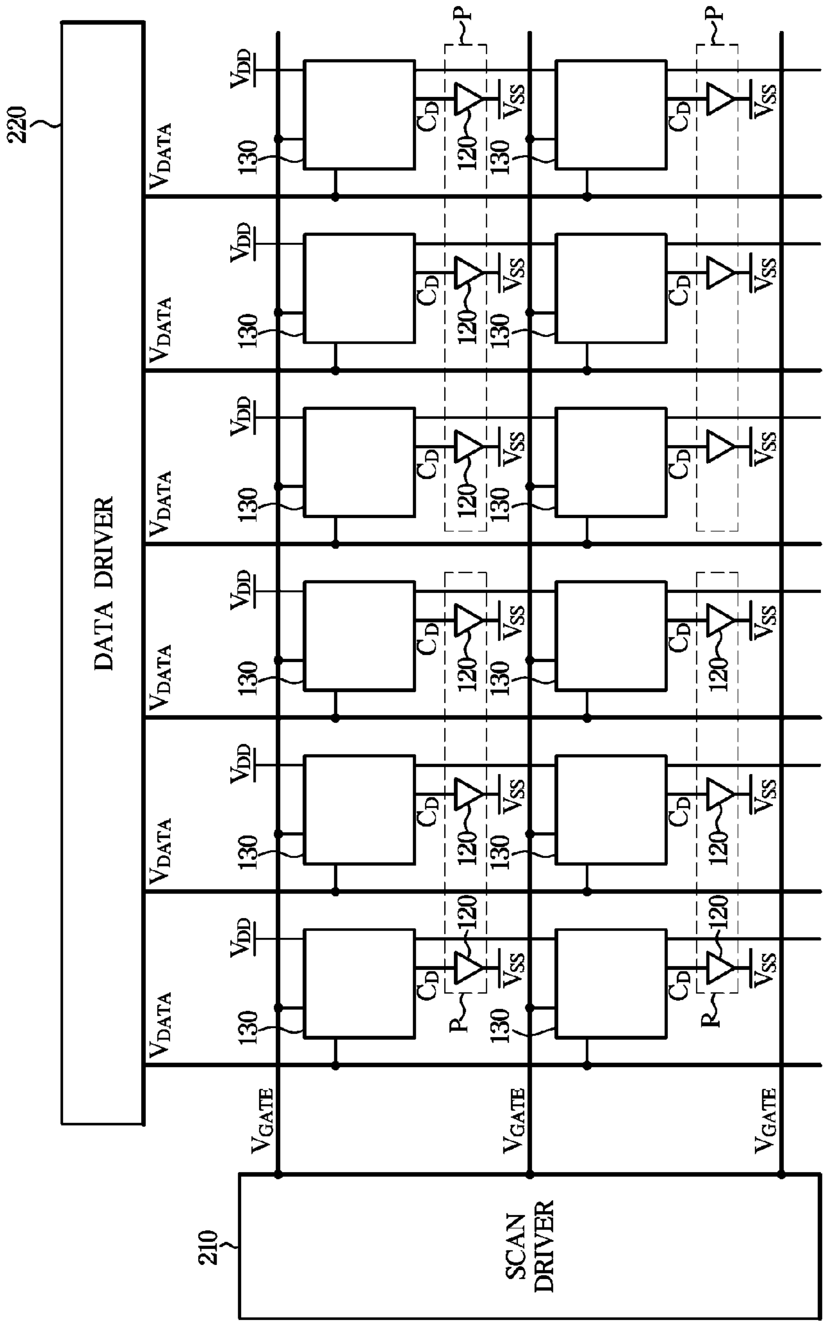
FIG. 5 is a diagram illustrating a method of driving each pixel in the display module according to an embodiment of the present disclosure.
Figure 6:
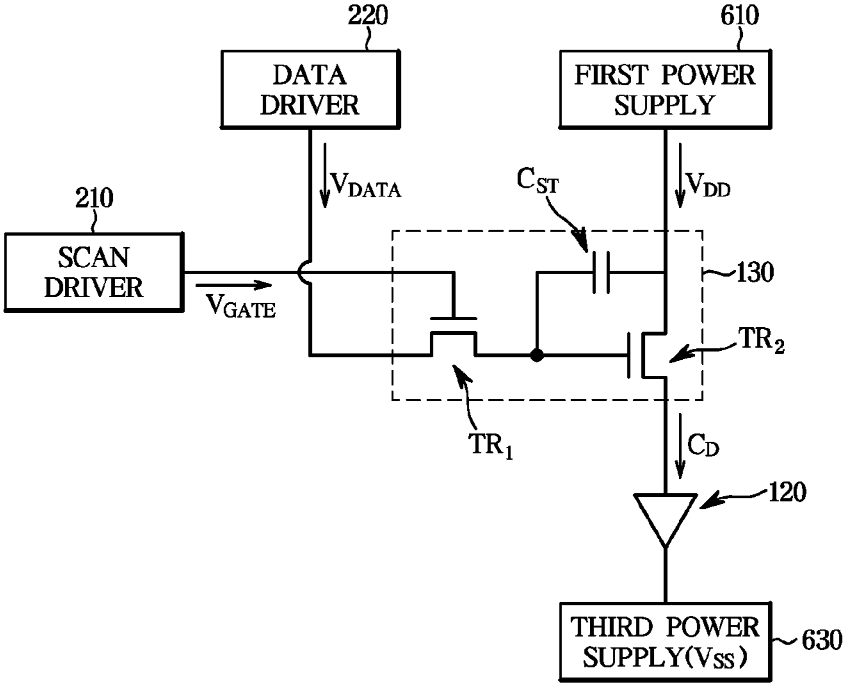
FIG. 6 is a diagram illustrating a pixel circuit for controlling a single subpixel in the display module according to an embodiment of the present disclosure.
Figure 7:
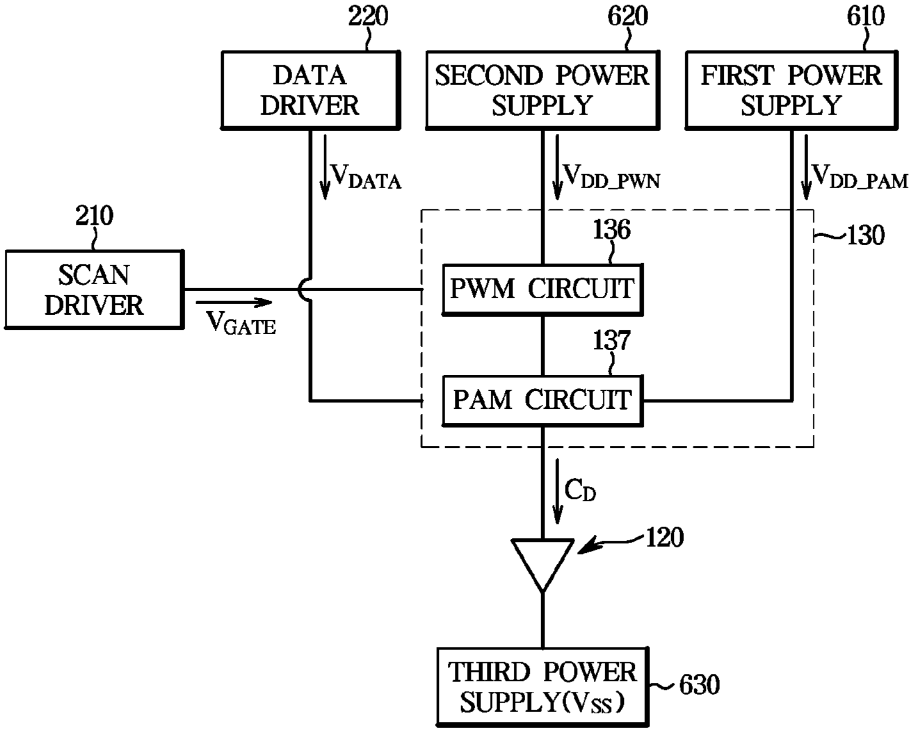
FIG. 7 is a diagram of an example of the pixel circuit for controlling the single subpixel in the display module according to an embodiment of the present disclosure.

FIG. 4 is a diagram in which the configuration of the display module 10 included in the display device 1 according to an embodiment of the present disclosure is specifically illustrated. FIG. 5 is a diagram illustrating a method of driving each of the pixels P in the display module 10 according to an embodiment of the present disclosure. FIG. 6 is a diagram illustrating a pixel circuit for controlling the single subpixel SP in the display module 10 according to an embodiment of the present disclosure. FIG. 7 is a diagram of an example of the pixel circuit for controlling the single subpixel SP in the display module 10 according to an embodiment of the present disclosure.

Referring to FIG. 4, each of the plurality of display modules 10-1, 10-2, . . . , and **10-*n* may include the display panel 100 displaying an image and the driver IC 200 driving the display panel 100**.

As described above, the display panel 100 may include the plurality of pixels P arranged in two dimensions, and each of the pixels P may be composed of the plurality of subpixels SP to implement various colors.

Also, as described above, the display device 1 according to an embodiment is a self-light-emitting display device in which each of the pixels P may emit light by itself. Accordingly, an inorganic light emitting element 120 may be disposed in each of the subpixels SP. That is, each of the plurality of pixels P may include two or more of the inorganic light emitting elements 120.

Although each of the inorganic light emitting elements 120 may be driven by an active matrix (AM) method or a passive matrix (PM) method, in an embodiment, which will be described later, a case in which the inorganic light emitting element 120 is driven by the AM method will be described as an example for detailed description.

In the display module 10 according to an embodiment, each of the inorganic light emitting elements 120 may be individually controlled by a pixel circuit 130, and the pixel circuit 130 may operate based on a driving signal output from the driver IC 200.

Referring to FIG. 5, the driver IC 200 may include a scan driver 210 and a data driver 220. The scan driver 210 may output a gate signal for turning on/off a subpixel, and the data driver 220 may output a data signal for implementing an image.

The scan driver 210 may generate a gate signal based on the control signal transmitted from the timing controller 500, and the data driver 220 may generate a data signal based on the image data transferred from the timing controller 500.

The pixel circuit 130 may individually control each of the inorganic light emitting elements 120, and the gate signal output from the scan driver 210 and the data signal output from the data driver 220 may be input to the pixel circuit 130. To this end, the pixel circuit 130 may include at least one thin film transistor (TFT).

For example, when a gate voltage VGATE, a data voltage VDATA, and a power voltage VDD are input to the pixel circuit 130, the pixel circuit 130 generates a driving current CD for driving the inorganic light emitting element 120.

The driving current CD output from the pixel circuit 130 may be input to the inorganic light emitting element 120, and the inorganic light emitting element 120 may implement an image by emitting light by the input driving current CD.

Referring to the example of FIG. 6, the pixel circuit 130 may include thin film transistors $TR_1$ and $TR_2$ for switching or driving the inorganic light emitting element 120 and a capacitor $C_{st}$. As described above, the inorganic light emitting element 120 may be a micro LED.

For example, the thin film transistors $TR_1$ and $TR_2$ may include the switching transistor $TR_1$ and the driving transistor $TR_2$, and the switching transistor $TR_1$ and the driving transistor $TR_2$ may be implemented as p-type metal-oxide-semiconductor (MOS) (PMOS) type transistors. However, the embodiments of the display module 10 and the display device 1 are not limited thereto, and the switching transistor $TR_1$ and the driving transistor $TR_2$ may be implemented as n-type MOS (NMOS) type transistors.

A gate electrode of the switching transistor $TR_1$ is connected to the scan driver 210, a source electrode is connected to the data driver 220, and a drain electrode is connected to one end of the capacitor $C_{st}$ and a gate electrode of the driving transistor $TR_2$. The other end of the capacitor $C_{st}$ may be connected to a first power supply 610.

A source electrode of the driving transistor $TR_2$ is connected to the first power supply 610 supplying the power voltage VDD, and the drain electrode is connected to an anode of the inorganic light emitting element 120. A cathode of the inorganic light emitting element 120 may be connected to a third power supply 630 supplying a reference voltage $V_{SS}$. The reference voltage $V_{SS}$, which is a voltage lower than the power voltage VDD, may provide a ground using a ground voltage or the like.

The pixel circuit 130 having the above structure may operate as follows. First, when the switching transistor $TR_1$ is turned on by applying the gate voltage VGATE from the scan driver 210, the data voltage VDATA applied from the data driver 220 may be transferred to the one end of the capacitor $C_{st}$ and the gate electrode of the driving transistor $TR_2$.

A voltage corresponding to a gate-source voltage $V_{GS}$ of the driving transistor $TR_2$ may be maintained for a predetermined time by the capacitor $C_{st}$. The driving transistor $TR_2$ may cause the inorganic light emitting element 120 to emit light by applying a driving current CD corresponding to the gate-source voltage $V_{GS}$ to the anode of the inorganic light emitting element 120.

However, the structure of the pixel circuit 130 described above is only an example applicable to the display module 10 according to an embodiment, and in addition to the example described above, various circuit structures for switching and driving the plurality of inorganic light emitting elements 120 may be applied.

In addition, in this embodiment, there is no limitation on a method of controlling brightness of the inorganic light emitting element 120. The brightness of the inorganic light emitting element 120 may be controlled by one of various methods such as a pulse amplitude modulation (PAM) method, a pulse width modulation (PWM) method, and a hybrid method combining the PAM method and the PWM method.

For example, as illustrated in FIG. 7, the pixel circuit 130 may control the brightness of the inorganic light emitting element 120 in the hybrid method including both of a PWM circuit 136 and a PAM circuit 137. The PWM circuit 136 may control a pulse width of the driving current CD based on an applied PWM data voltage, and the PAM circuit 137 may control an amplitude of the driving current CD based on an applied PAM data voltage.

At this time, a first power voltage VDD_PAM may be provided to the PAM circuit 137, and the second power voltage VDD_pwm may be provided to the PWM circuit 136. In this case, the first power voltage VDD_PAM and the second power voltage VDD_PWM may be provided to the PAM circuit 137 and the PWM circuit 136 through different lines, respectively. That is, the first power supply 610 may output the first power voltage VDD_PAM, and the second power supply 620 may output the second power voltage VDD_pwm.

Although it will be illustrated below as an example that the power supply supplying the power voltage VDD is composed of both the first power supply 610 and the second power supply 620, only the first power supply 610 may be included according to an embodiment.

Figure 8:
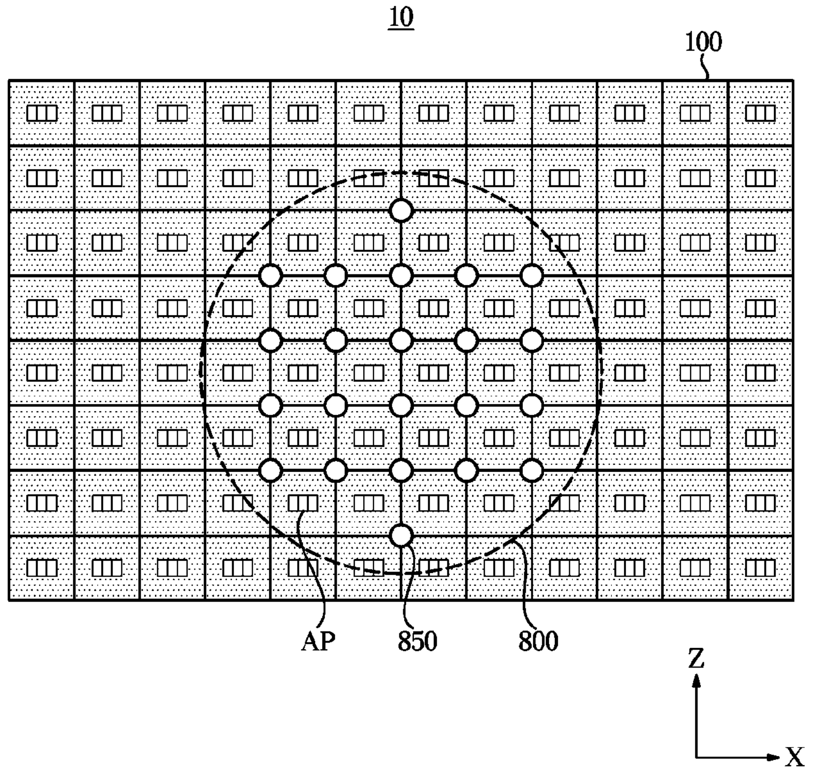
FIG. 8 is a diagram illustrating an example of arrangement of transparent regions of the display module according to an embodiment of the present disclosure.
Figure 9:
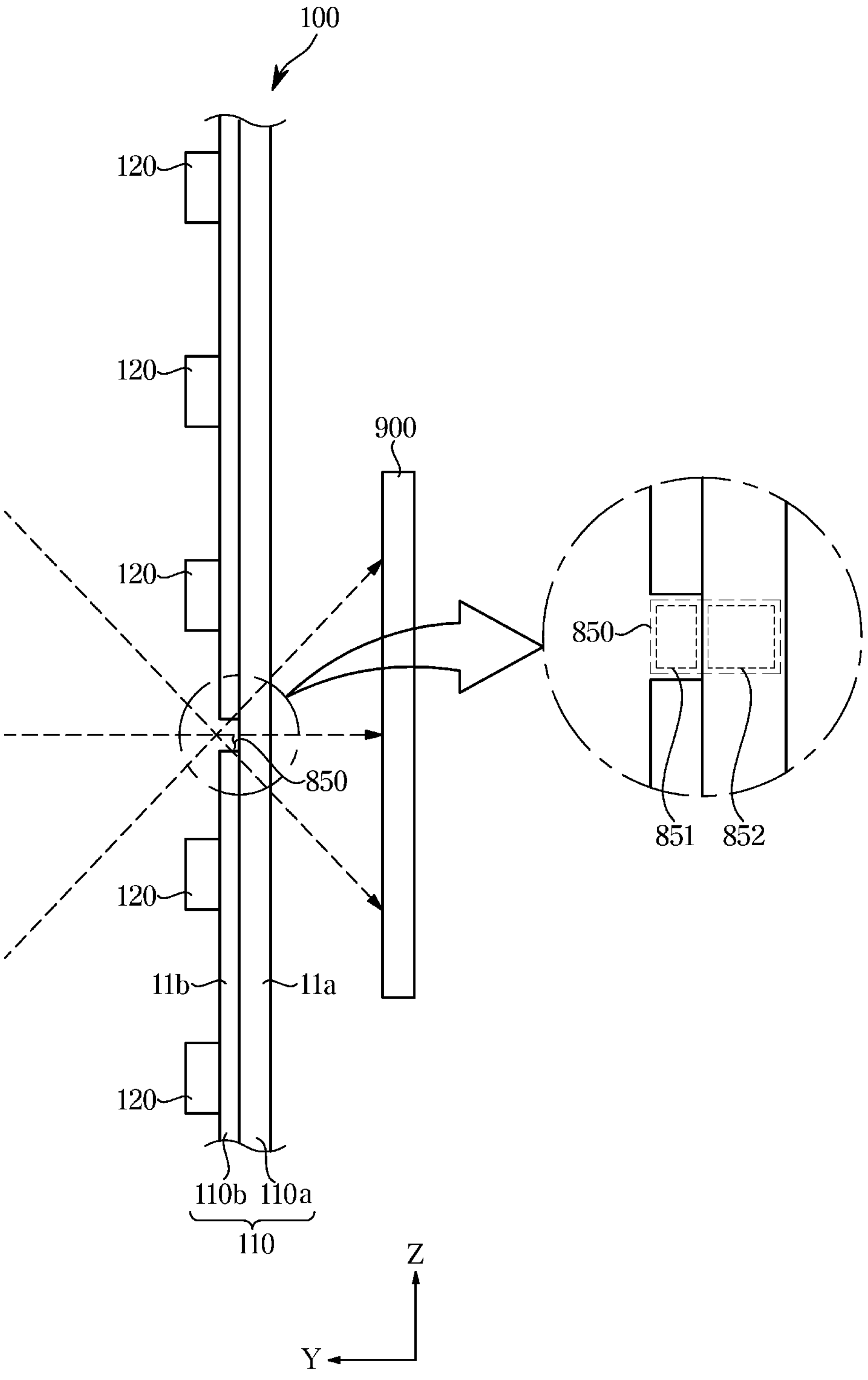
FIG. 9 is a cross-sectional view illustrating a case in which light passes through the transparent region and is provided to an image sensor in the display module according to an embodiment of the present disclosure.
Figure 10:
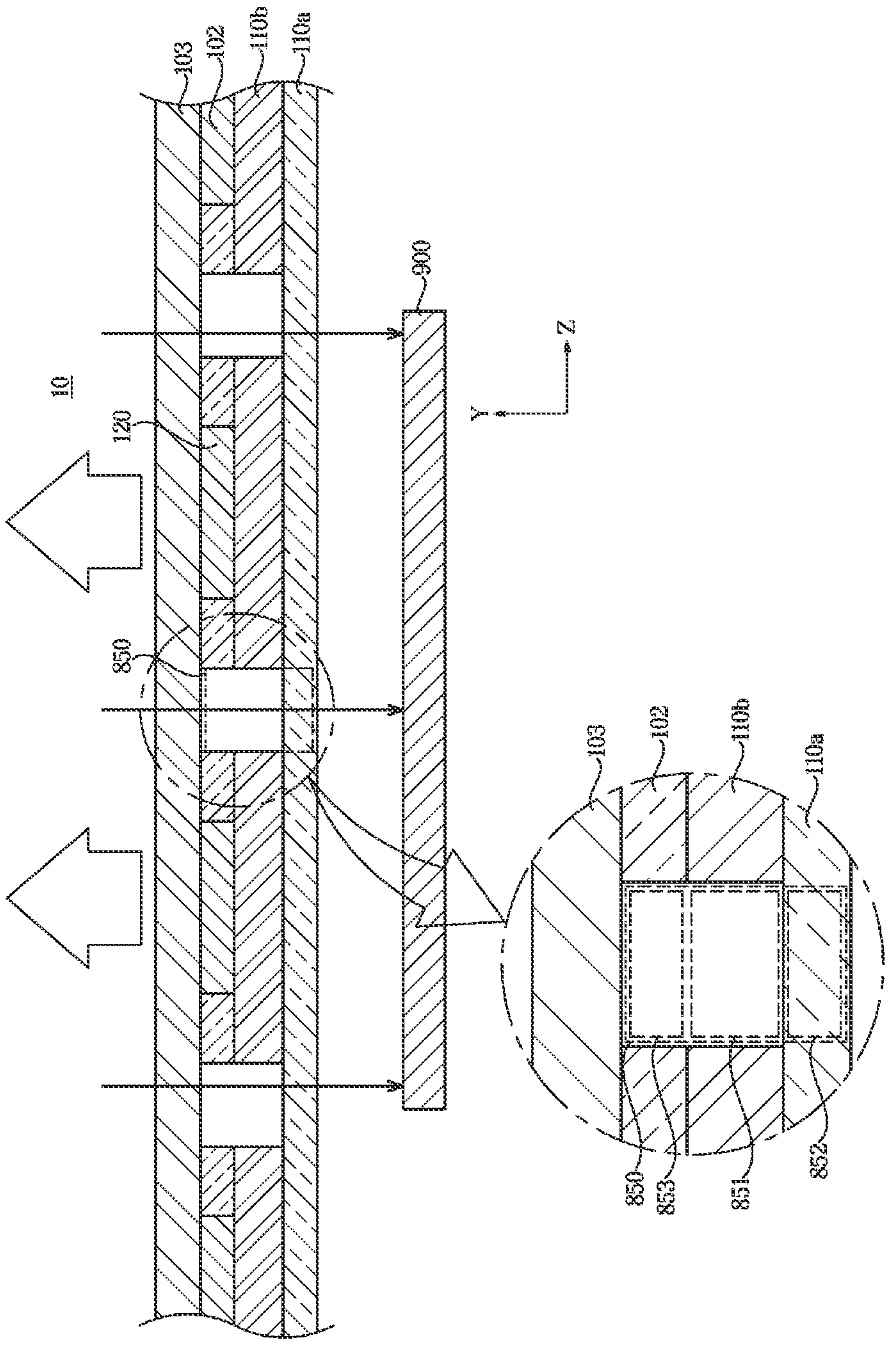
FIG. 10 is a cross-sectional view schematically illustrating formation of the transparent region in the display module according to an embodiment of the present disclosure.

FIG. 8 is a diagram illustrating an example of arrangement of transparent regions of the display module 10 according to an embodiment of the present disclosure. FIG. 9 is a cross-sectional view illustrating a case in which light passes through the transparent region and is radiated to an image sensor in the display module 10 according to an embodiment of the present disclosure. FIG. 10 is a cross-sectional view schematically illustrating formation of the transparent region in the display module 10 according to an embodiment of the present disclosure.

Referring to FIGS. 8 to 10, the display module 10 according to an embodiment includes the display panel 100 in which the pixels P are arranged in two dimensions, and an image sensor 900 disposed on the rear of the display panel 100.

The image sensor 900, which is a semiconductor that obtains image data by converting incident light into a digital signal, may be a complementary metal-oxide semiconductor (CMOS) image sensor using a CMOS. However, the type of the image sensor 900 is not limited, and a known type of image sensor may be employed.

In this case, the display panel 100 may include a plurality of transparent regions 850 formed in a region 800 corresponding to a position of the image sensor 900 and provided to allow external light to be incident on the image sensor 900. As illustrated in FIG. 8, the plurality of transparent regions 850 may be formed to have the same diameter according to an embodiment.

Light incident from the front of the display panel 100 may pass through each of the plurality of transparent regions 850 and be incident on the image sensor 900, and through this, the image sensor 900 may obtain image data of an object located in front of the display panel 100.

That is, the display module 10 according to an embodiment may realize an under display camera (UDC) function by providing the image sensor 900 at the rear of the display panel 100 and providing the plurality of transparent regions 850 through which light may pass on the display panel 100.

Each of the plurality of transparent regions 850 may be provided between the apertures AP of each of two or more pixels among the pixels P. For example, as illustrated in FIG. 8, the transparent region 850 may be provided between the apertures AP of each of the four pixels P.

In this case, the transparent region 850 may be provided to have a smaller diameter than a pixel interval PP between the pixels P, and may be, for example, provided to have a diameter smaller than the inorganic light emitting element 120 having the size of about 100 micrometers.

The pixel interval PP may be referred to as a pixel pitch, and may be defined as representing a distance from the center of one pixel to the center of an adjacent pixel.

As such, the transparent region 850 may not affect the two-dimensional arrangement of the pixels P by being provided between the apertures AP of the pixels P and being provided to have a size smaller than the pixel interval PP between the pixels P, and may maintain the resolution of the display panel 100 as when the transparent region 850 does not exist. In other words, in the display panel 100 according to the present disclosure, even when the transparent region 850 is included, a pixel interval PP between pixels P may be maintained constant.

The display panel 100 includes a back plate 110 including the pixel circuit 130 to supply the driving current CD to the inorganic light emitting element 120, and the inorganic light emitting element 120 formed on the back plate 110.

The back plate 110 may also include a transparent substrate **110*a*, and a signal electrode layer 110*b* formed on the transparent substrate 110*a* and including a pixel circuit layer and a plurality of electrode layers to transmit a control signal to the inorganic light emitting element 120**.

As illustrated in FIG. 9, the transparent region 850 may include a pinhole 851 formed on the signal electrode layer **110*b*, and a region 852 of the transparent substrate 110*a* overlapping the pinhole 851** in one direction (Y direction).

The diameter of the transparent region 850 may correspond to a diameter of the pinhole 851 formed on the signal electrode layer **110*b***, and as described above, may be formed to be smaller than the pixel interval PP between the pixels P.

As such, the transparent region 850 may be formed to have a diameter equal to the size of the pinhole 851, and may generate an inverted image of an external object on the image sensor 900 as light emitted from the external object passes through the transparent region 850 having a diameter equal to the size of the pinhole 851.

In other words, the display module 10 may obtain image data of an external object through the image sensor 900 even without a lens like a pinhole camera by including the transparent region 850 having the size of the pinhole 851. As such, the display module 10 according to the present disclosure may reduce a product cost by obtaining image data of an external object using only the image sensor 900 without a lens.

As illustrated in FIG. 10, when a black matrix layer 102 is formed on the back plate 110, the transparent region 850 may include a pinhole 853 of the black matrix layer 102, the pinhole 851 of the signal electrode layer **110*b* overlapping the pinhole 853 of the black matrix layer 102 in one direction (Y direction), and the region 852 of the transparent substrate 110*a* overlapping the pinhole 853 of the black matrix layer 102 and the pinhole 851 of the signal electrode layer 110*b*** in one direction (Y direction).

That is, light incident from the front of the display panel 100 may pass through a protective film 103 and be incident on the image sensor 900 through the transparent region 850. Specifically, light incident from the front of the display panel 100 may sequentially pass through the protective film 103, the pinhole 853 of the black matrix layer 102 and the region 852 of the transparent substrate **110*a*, and finally be transmitted to the image sensor 900**.

Figure 11:
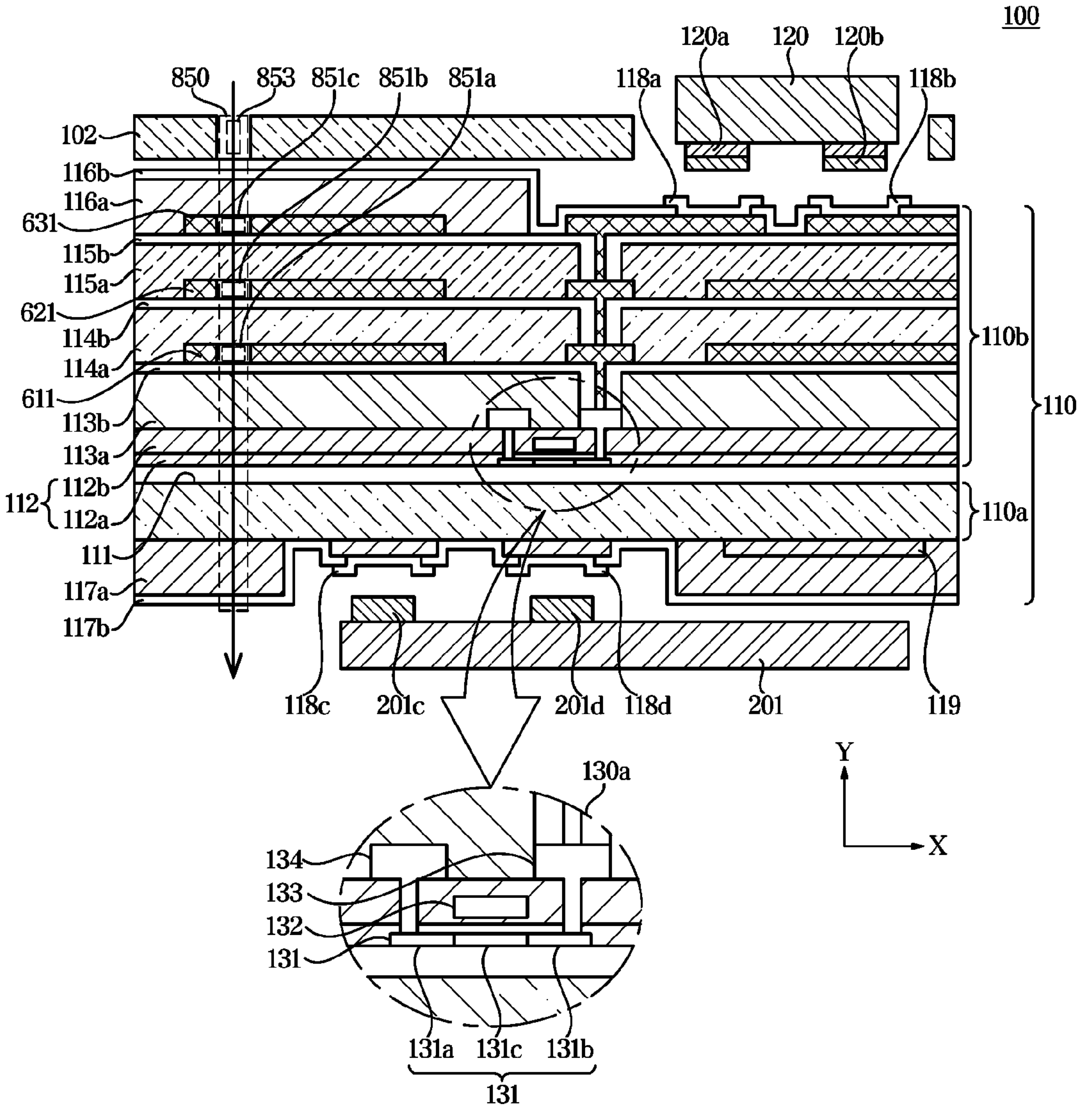
FIG. 11 is a cross-sectional view illustrating a partial region of a display panel including the transparent region according to an embodiment of the present disclosure.
Figure 12:
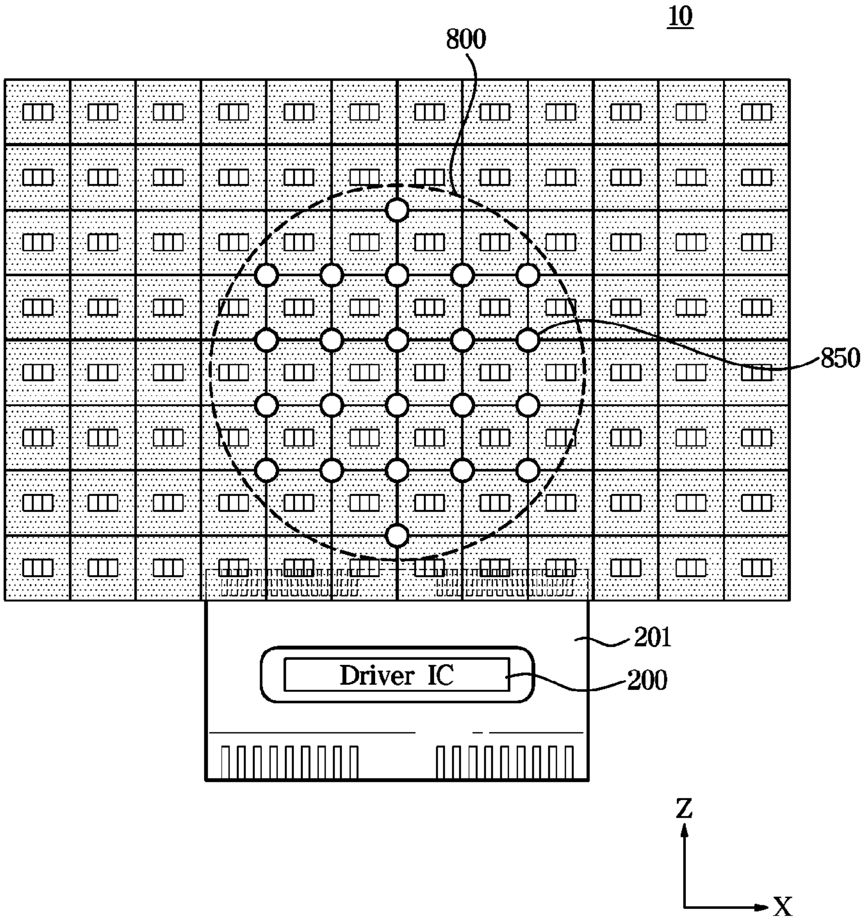
FIG. 12 is a diagram illustrating an example of a method of electrically connecting the display panel and a driver integrated circuit (IC) in the display module according to an embodiment of the present disclosure.
Figure 13:
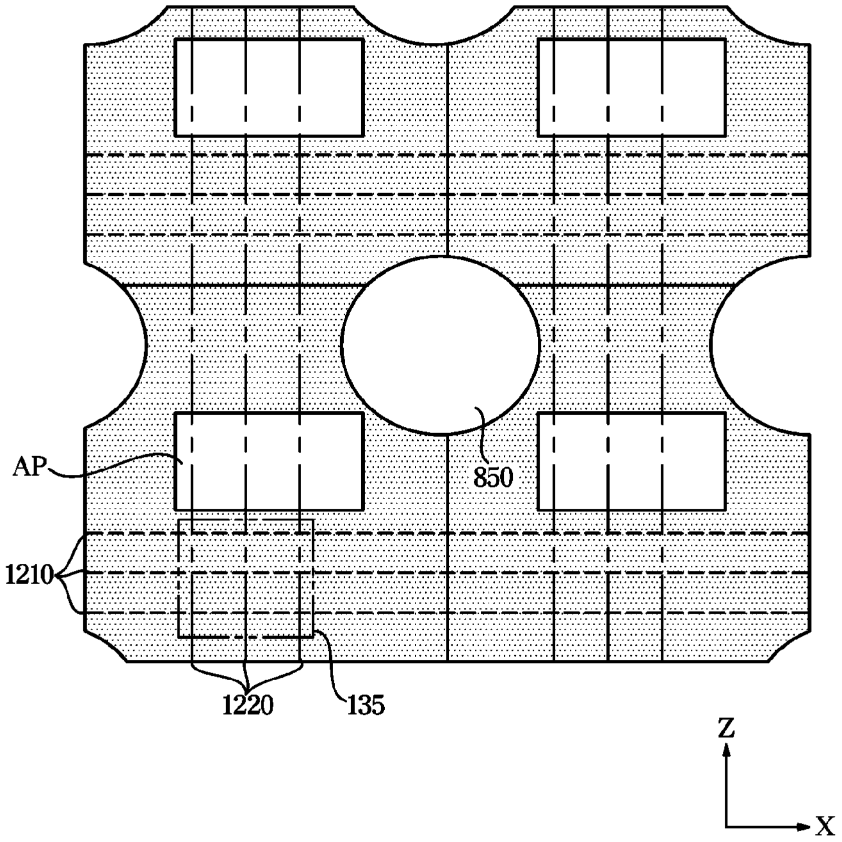
FIG. 13 is a diagram illustrating an arrangement relationship between the pixels and the transparent region in the display module according to an embodiment of the present disclosure.

FIG. 11 is a cross-sectional view illustrating a partial region of the display panel 100 including the transparent region 850 according to an embodiment of the present disclosure. FIG. 12 is a diagram illustrating an example of a method of electrically connecting the display panel 100 and the driver IC 200 in the display module 10 according to an embodiment of the present disclosure. FIG. 13 is a diagram illustrating an arrangement relationship between the pixels P and the transparent region 850 in the display module 10 according to an embodiment of the present disclosure.

Referring to FIG. 11, as described above, the display panel 100 according to an embodiment includes the back plate 110 including the transparent substrate **110*a* and the signal electrode layer 110***b* formed on the transparent substrate 110*a* to transmit a control signal to the inorganic light emitting element 120.

The transparent substrate 110*a* may be implemented as one of transparent material substrates such as a glass substrate and a silicon substrate. The signal electrode layer 110*b* may include a pixel circuit layer 112 on which the pixel circuit 130 is provided, and a plurality of electrode layers 611, 621, and 631 provided to supply the power voltage VDD or the reference voltage $V_{SS}$.

The pixel circuit layer 112 may be formed on the transparent substrate 110*a*. Specifically, the pixel circuit layer 112 is formed on an upper surface of the transparent substrate 110*a* and may be provided on an upper surface of a buffer layer 111. The buffer layer 111 may provide a flat surface at an upper end of the transparent substrate 110*a*, and may block penetration of foreign substances or moisture through the transparent substrate 110*a*. For example, the buffer layer 111 may contain an inorganic material such as silicon oxide, silicon nitride, and silicon oxynitride, aluminum oxide, aluminum nitride, titanium oxide and titanium nitride or an organic material such as polyimide, polyester and acryl, and may be formed of a plurality of stacked bodies among the materials illustrated.

As described above, the pixel circuit layer 112 may be provided with the pixel circuit 130, and the pixel circuit 130 may include a thin film transistor 130*a* disposed on the buffer layer 111. The thin film transistor 130*a* may include an active layer 131, a gate electrode 132, a drain electrode 133 and a source electrode 134. The active layer 131 may be made of a semiconductor material, and may include the source region 131*a*, the drain region 131*b*, and a channel region 131*c* between the source region 131*a* and the drain region 131*b*.

The gate electrode 132 may be disposed above the active layer 131 to correspond to the channel region 131*c*. The gate electrode 132 and the drain electrode 133 may be electrically connected to the source region 131*a* and the drain region 131*b* of the active layer 131, respectively. Although this embodiment illustrates a case in which the thin film transistor 130*a* is implemented as a top gate type in which the gate electrode 132 is disposed above the active layer 131, the gate electrode 132 may be disposed below the active layer 131.

A first insulating layer 112*b* made of an inorganic insulating material may be disposed between the active layer 131 and the gate electrode 132, and a second insulating layer 113*a* may be disposed on the gate electrode 132. The first insulating layer 112*b* may be a gate insulating layer, and the second insulating layer 113*a* may be an interlayer insulating layer. In this embodiment, the arrangement of one component on another component may include not only a structure in which the entirety of the one component is located above the other component, but also a structure in which the one component surrounds or covers the entirety or a part of the other component. In addition, the covering of another component by one component may include not only a structure in which the one component covers the entirety of the other component, but also a structure in which a hole is formed on the one component and a part of the other component is exposed through the corresponding hole.

Therefore, the gate insulating layer 112*b* may cover the active layer 131 by being formed on the buffer layer 112*a* on which the active layer 131 is disposed, and the interlayer insulating layer 113*a* may cover the gate electrode 132 by being formed on the gate insulating layer 112*b* on which the gate electrode 132 is disposed.

The source electrode 134 and the drain electrode 133 may be disposed on the interlayer insulating layer 113*a*. Holes may be formed at positions of the interlayer insulating layer 113*a* and the gate insulating layer 112*b* covering the source electrode 134 and the drain electrode 133, that is, the positions corresponding to the source electrode 134 and the drain electrode 133, and the source electrode 134 and the drain electrode 133 may be electrically connected to the source region 131*a* and the drain region 131*b* of the active layer 131 through the holes, respectively. In this embodiment, the electrical connection may include not only a case in which conductive materials that conduct electricity are directly soldered, but also a case of connection through a separate wire and a case in which a current flowing layer such as an anisotropic conductive film (ACF) is disposed therebetween. Current only needs to flow between two components connected, and there are no limitations on specific connection methods. Also, in an embodiment, which will be described later, connection between components may include electrical connection.

A fourth insulating layer 113*b* may be disposed on the interlayer insulating layer 113*a* on which the source electrode 134 and the drain electrode 133 are disposed. The fourth insulating layer 113*b* may be a planarization layer. The planarization layer 113*b* may cover the source electrode 134, the drain electrode 133, and the interlayer insulating layer 113*a* by being disposed on the interlayer insulating layer 113*a* on which the source electrode 134 and the drain electrode 133 are disposed.

The first power electrode layer 611 connected to the first power supply 610 may be disposed on the planarization layer 113*b*. The first power electrode layer 611 is made of a conductive material such as metal and may be electrically connected to other electrodes by being exposed from the insulating layer. For example, the first power electrode layer 611 may be electrically connected to the drain electrode 133 of the thin film transistor 130*a* and may be connected to the second power electrode layer 621, which will be described later. That is, a hole may be formed at a position of the interlayer insulating layer 113*a* corresponding to the drain electrode 133, and the first power electrode layer 611 may be electrically connected to the drain electrode 133 through the hole.

A fifth insulating layer 114*a* covering electrode pads of the first power electrode layer 611 may be disposed on the first power electrode layer 611, and a sixth insulating layer 114*b* may be disposed on the fifth insulating layer 114*a*. For example, the fifth insulating layer 114*a* may correspond to an interlayer insulating layer formed of an organic insulating material, and the sixth insulating layer 114*b* may correspond to a planarization layer formed of an inorganic insulating material.

The second power electrode layer 621 connected to the second power supply 620 may be disposed on the planarization layer 114*b*. The second power electrode layer 621 is made of a conductive material such as metal and may be electrically connected to other electrodes by being exposed from the insulating layer. For example, the second power electrode layer 621 may be electrically connected to the first power electrode layer 611 and may be connected to the second power electrode layer 621, which will be described later. That is, a hole may be formed at a position of the interlayer insulating layer 114*a* corresponding to the drain electrode 133, and the second power electrode layer 621 may be electrically connected to the first power electrode layer 611 through the hole.

A seventh insulating layer 115*a* covering electrode pads of the second power electrode layer 621 may be disposed on the second power electrode layer 621, and an eighth insulating layer 115*b* may be disposed on the seventh insulating layer 115*a*. For example, the seventh insulating layer 115*a* may correspond to an interlayer insulating layer formed of an organic insulating material, and the eighth insulating layer 115*b* may correspond to a planarization layer formed of an inorganic insulating material.

The third power electrode layer 631 connected to the third power supply 630 may be disposed on the planarization layer 115*b*. The third power electrode layer 631 is made of a conductive material such as metal and may be electrically connected to other electrodes by being exposed from the insulating layer. For example, the third power electrode layer 631 may be electrically connected to the second power electrode layer 621 and may be connected to electrode pads 118*a* and 118*b*. That is, a hole may be formed at a position of the interlayer insulating layer 115*a* corresponding to the drain electrode 133, and the third power electrode layer 631 may be electrically connected to the second power electrode layer 621 through the hole.

A ninth insulating layer 116*a* covering electrode pads of the third power electrode layer 631 may be disposed on the third power electrode layer 631, and a tenth insulating layer 116*b* may be disposed on the ninth insulating layer 116*a*. For example, the ninth insulating layer 116*a* may correspond to an interlayer insulating layer formed of an organic insulating material, and the tenth insulating layer 116*b* may correspond to a planarization layer formed of an inorganic insulating material.

In this case, the ninth insulating layer 116*a* may not be disposed in a region corresponding to the aperture AP where the inorganic light emitting element 120 is positioned, and a hole is formed on the tenth insulating layer 116*b* such that the electrode pads 118*a* and 118*b* to which the inorganic light emitting element 120 may be electrically connected may be electrically connected to the third power electrode layer 631.

Depending on an embodiment, in a case where the second power supply 620 is omitted, the second power electrode layer 621 may be omitted, and only the first power electrode layer 611 and the third power electrode layer 631 may be provided.

The display panel 100 may include the inorganic light emitting element 120 electrically connected through the electrode pads 118*a* and 118*b* on the back plate 110. An anode 120*a* and a cathode 120*b* of the inorganic light emitting element 120 may be electrically connected to the corresponding electrode pads 118*a* and 118*b*.

The display panel 100 may also include the black matrix layer 102 disposed on the back plate 110 and blocking light in a region except for the aperture AP of each of the plurality of pixels P.

The display panel 100 may also include the plurality of transparent regions 850 formed in a region corresponding to the position of the image sensor 900 and provided to allow external light to be incident on the image sensor 900.

In this case, the transparent region 850 may include a plurality of pinholes 851*a*, 851*b*, and 851*c* formed on the plurality of power electrode layers 611, 621, and 631, respectively, and overlapping in one direction (Y direction).

The transparent region 850 may include the pinhole 853 of the black matrix layer 102 overlapping the respective pinholes 851*a*, 851*b*, and 851*c* of the plurality of power electrode layers 611, 621, and 631 in one direction (Y direction).

That is, the first power electrode layer 611 may include the pinhole 851*a* in which electrodes are not formed, and the second power electrode layer 621 may include the pinhole 851*b* in which electrodes are not formed at a position corresponding to the pinhole 851*a* of the first power electrode layer 611.

The third power electrode layer 631 may include the pinhole 851*c* in which electrodes are not formed at a position corresponding to the pinhole 851*b* of the second power electrode layer 621, and the black matrix layer 102 may include the pinhole 853 in which a black matrix are not formed at a position corresponding to the pinhole 851*c* of the third power electrode layer 631.

Through this, light incident from the front of the display panel 100 may reach the image sensor 900 by sequentially passing through the pinhole 853 of the black matrix layer 102, the pinhole 851*c* of the third power electrode layer 631, the pinhole 851*b* of the second power electrode layer 621, and the pinhole 851*a* of the first power electrode layer 611, which constitute the transparent regions 850.

In this case, the transparent regions 850 may include regions of the insulating layers 111, 112*a*, 112*b*, 113*a*, 113*b*, 114*a*, 114*b*, 115*a*, 115*b*, 116*a*, and 116*b* overlapping the pinholes 851*a*, 851*b*, 851*c*, and 853 in one direction (Y direction) and the region 852 of the transparent substrate 110*a*. That is, the light incident from the front of the display panel 100 may reach the image sensor 900 by passing through the pinholes 851*a*, 851*b*, 851*c* and 851, which constitute the transparent regions 850, the regions of the insulating layer 111, 112*a*, 112*b*, 113*a*, 113*b*, 114*a*, 114*b*, 115*a*, 115*b*, 116*a* and 116*b*, and the region 852 of the transparent substrate 110*a*.

The transparent region 850 may also be formed in a region of the pixel circuit layer 112 in which the pixel circuit 130 is not positioned. That is, as illustrated in FIG. 11, the transparent region 850 may be formed in a region in which the thin film transistor 130*a* is not provided.

As illustrated in FIGS. 11 and 12, the transparent region 850 may also be formed in a region in which a flexible printed circuit board (FPCB) 201 on which the driver IC 200 is mounted and electrically connected to a rear surface of the back plate 110 is not positioned.

An electrode layer 119 capable of being electrically connected to the driver IC 200 may be provided on a rear surface of the transparent substrate 110*a* of the back plate 110, an eleventh insulating layer 117*a* covering the electrode pads may be disposed on a rear surface of the electrode layer 119, and a twelfth insulating layer 117*b* may be disposed on a rear surface of the eleventh insulating layer 117*a*. For example, the eleventh insulating layer 117*a* may correspond to an interlayer insulating layer formed of an organic insulating material, and the twelfth insulating layer 117*b* may correspond to a planarization layer formed of an inorganic insulating material.

In this case, the eleventh insulating layer 117*a* may not be disposed in a region corresponding to a position of the FPCB 201, and a hole may be formed on the twelfth insulating layer 117*b* such that electrode pads 118*c* and 118*d* capable of being electrically connected to electrodes 201*c* and 201*d* of the FPCB 201 may be provided therein.

The transparent region 850 may be formed in a region in which the FPCB 201 is not positioned in the Y direction on the back plate 110 to prevent light from not being transferred to the image sensor 900.

To this end, as illustrated in FIG. 12, the image sensor 900 may also be provided in a rear region of the back plate 110 that does not overlap with the FPCB 201.

However, depending on an embodiment, unlike illustrated in FIGS. 11 and 12, a pinhole overlapping the transparent region 850 in one direction (Y direction) may also be formed on the FPCB 201.

As illustrated in FIG. 13, the transparent region 850 may also be formed in a region in which signal wires on the pixel circuit layer 112 are not positioned. Specifically, the transparent region 850 may be formed in a region in which a scan line 1210 connected to the scan driver 210 to transmit a gate signal and a data line 1220 connected to the data driver 220 to transmit a data signal are not positioned. As described above, the transparent region 850 may also be formed in the region 135 in which the pixel circuit 130 is not positioned.

As such, the transparent region 850 is provided in a region in the back plate 110 in which the signal wires (e.g., the scan line 1210 and the data line 1220) and the pixel circuit 130 are not positioned, such that the light incident from the front of the display panel 100 may be transferred to the image sensor 900 by passing through the back plate 110.

Figure 14:
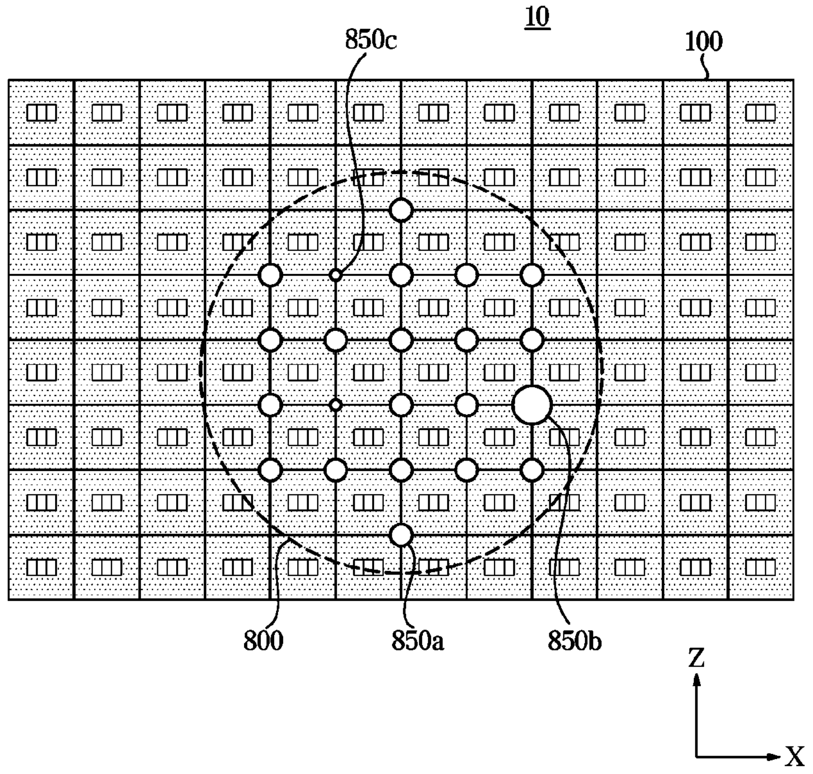
FIG. 14 is a diagram illustrating a case in which the display module includes transparent regions having diameters of different sizes according to an embodiment of the present disclosure.
Figure 15:
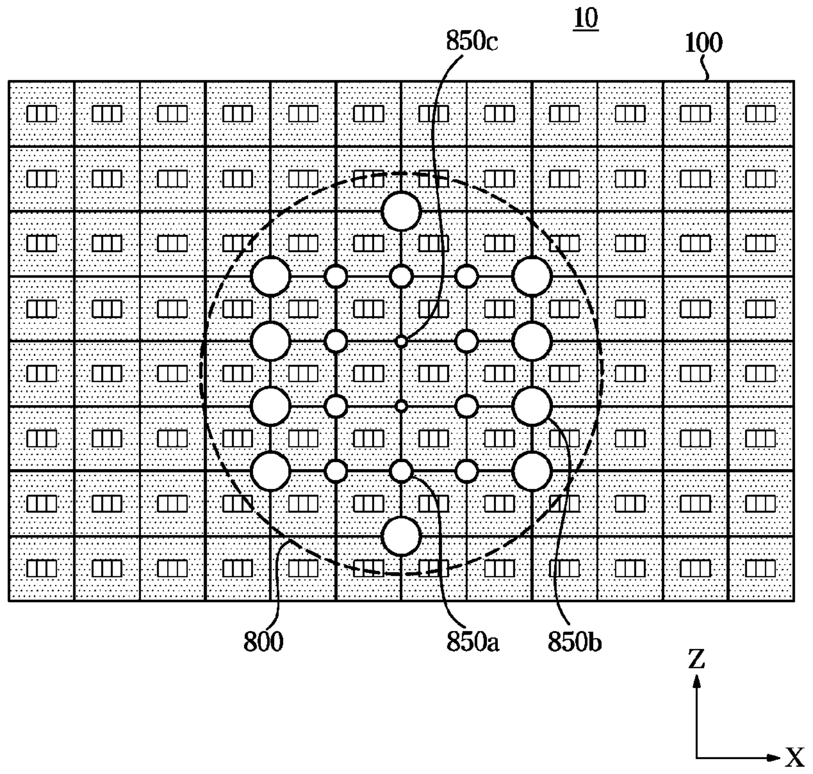
FIGS. 15, 16 and 17 are diagrams illustrating an example of arrangement of the transparent regions of the display module according to an embodiment of the present disclosure.
Figure 16:
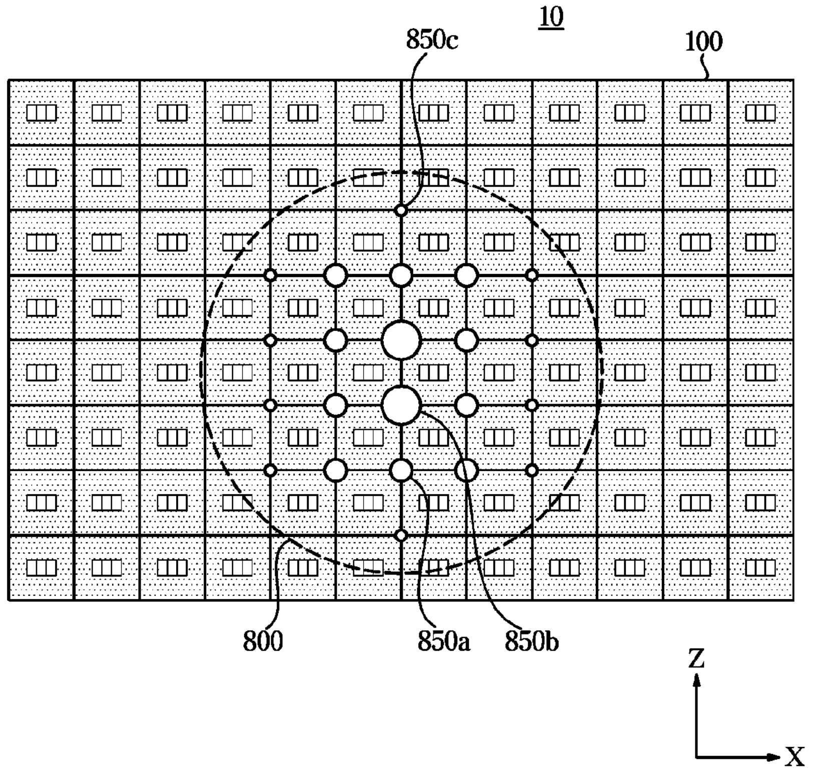
Figure 17:
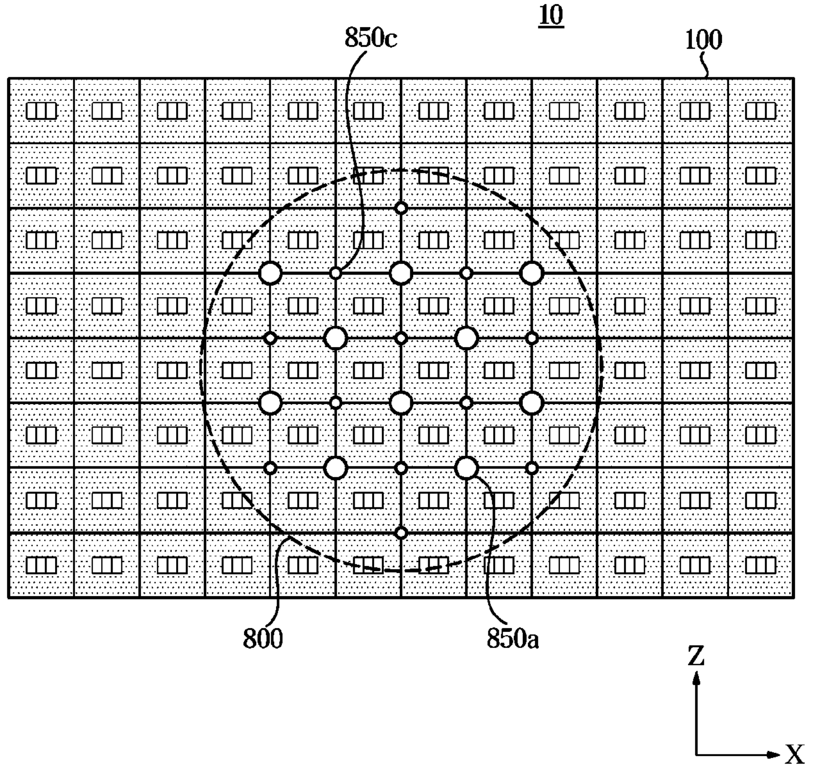

FIG. 14 is a diagram illustrating a case in which the display module 10 includes the transparent regions 850 having diameters of different sizes according to an embodiment of the present disclosure. FIGS. 15, 16 and 17 are diagrams illustrating an example of arrangement of the transparent regions 850 of the display module 10 according to an embodiment of the present disclosure.

Referring to FIG. 14, the display module 10 according to an embodiment may include the plurality of transparent regions 850 formed in the region 800 corresponding to the position of the image sensor 900 to allow external light to be incident on the image sensor 900.

According to an embodiment, as illustrated in FIG. 14, the plurality of transparent regions 850 may include transparent regions 850*a*, 850*b*, and 850*c* having diameters of different sizes.

For example, the plurality of transparent regions 850 may include the at least one first transparent region 850*a* having a first diameter, the at least one second transparent region 850*b* having a second diameter larger than the first diameter, and the at least one third transparent region 850*c* having a third diameter smaller than the first diameter.

Through this, the display module 10 may obtain image data with higher luminance and higher precision. Specifically, an amount of light passing through the display panel 100 may be increased and the luminance of image data may be increased by the second transparent region 850*b* having a relatively large diameter. In addition, the precision of an image formed on the image sensor 900 may be increased by the third transparent region 850*c* having a relatively small diameter, such that the precision of image data may be increased.

Although FIG. 14 illustrates the three transparent regions 850*a*, 850*b*, and 850*c* having different diameters as an example, the number of diameter types is not limited to three, and depending on an embodiment, three or more diameter types may be provided.

Also, the transparent region 850 having a smaller diameter may be formed on the display panel 100 as it is closer to the center of the region 800 corresponding to the position of the image sensor 900. Through this, the display module 10 may obtain image data with high precision in a central region.

For example, as illustrated in FIG. 15, the third transparent region 850*c* having a relatively small diameter may be provided at the center of the region 800 corresponding to the position of the image sensor 900, the second transparent region 850*b* having a relatively large diameter may be provided at a boundary of the region 800 corresponding to the position of the image sensor 900, and the first transparent region 850*a* may be provided between the center and the boundary of the region 800.

Also, the transparent region 850 having a larger diameter may be formed on the display panel 100 as it is closer to the center of the region 800 corresponding to the position of the image sensor 900. Through this, the display module 10 may obtain image data having high luminance in the central region.

For example, as illustrated in FIG. 16, the second transparent region 850*b* having a relatively large diameter may be provided at the center of the region 800 corresponding to the position of the image sensor 900, the third transparent region 850*c* having a relatively small diameter may be provided at the boundary of the region 800 corresponding to the position of the image sensor 900, and the first transparent region 850*a* may be provided between the center and the boundary of the region 800.

Also, on the display panel 100, the plurality of transparent regions 850 in the region 800 corresponding to the position of the image sensor 900 may be provided to have diameters different from those of the adjacent transparent regions. Through this, the display module 10 may obtain image data having constant luminance and precision in the entire region.

For example, as illustrated in FIG. 17, the first transparent region 850*a* and the third transparent region 850*c* may be alternately disposed in the region 800 corresponding to the position of the image sensor 900. In this case, the one first transparent region 850*a* may be disposed between the third transparent regions 850*c*, and the one third transparent region 850*c* may be disposed between the first transparent regions 850*a*, such that the plurality of transparent regions 850 may be provided to have diameters different from those of the adjacent transparent regions.

Figure 18:
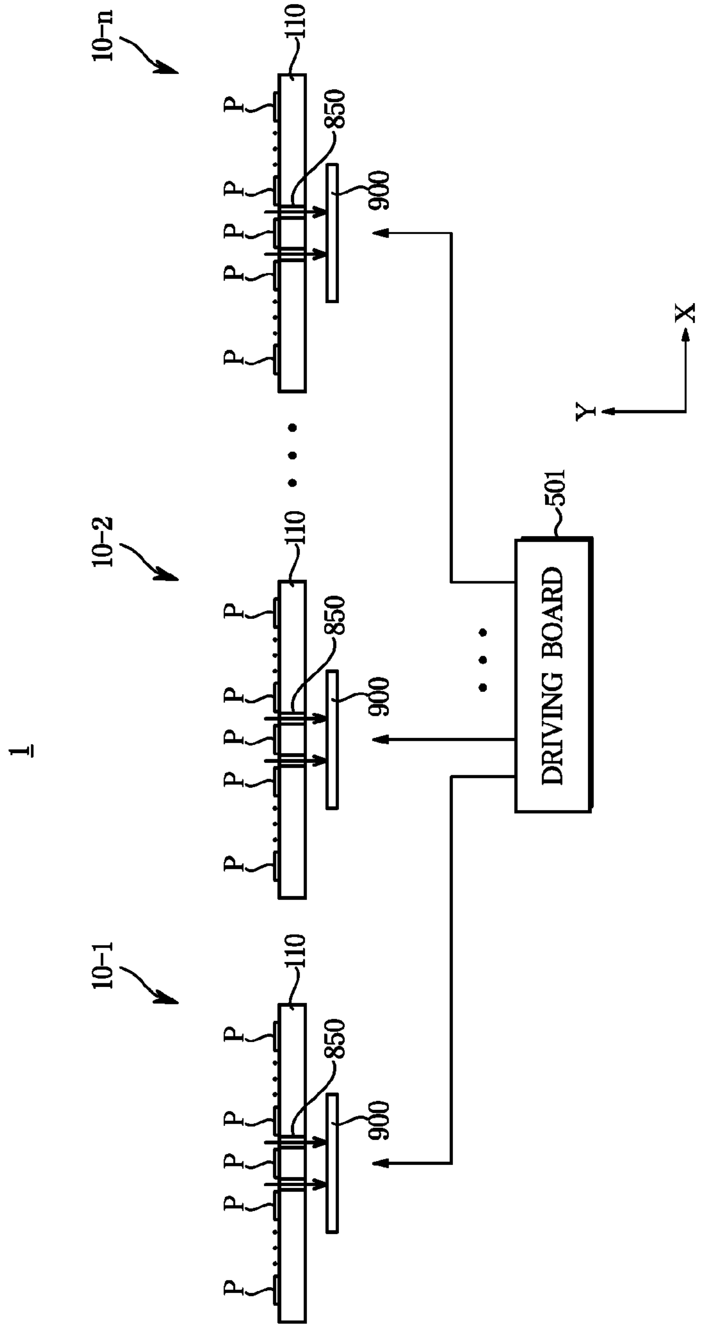
FIGS. 18 and 19 are diagrams illustrating examples of signals that are transmitted to a plurality of tiled display modules in the display device according to an embodiment.
Figure 19:
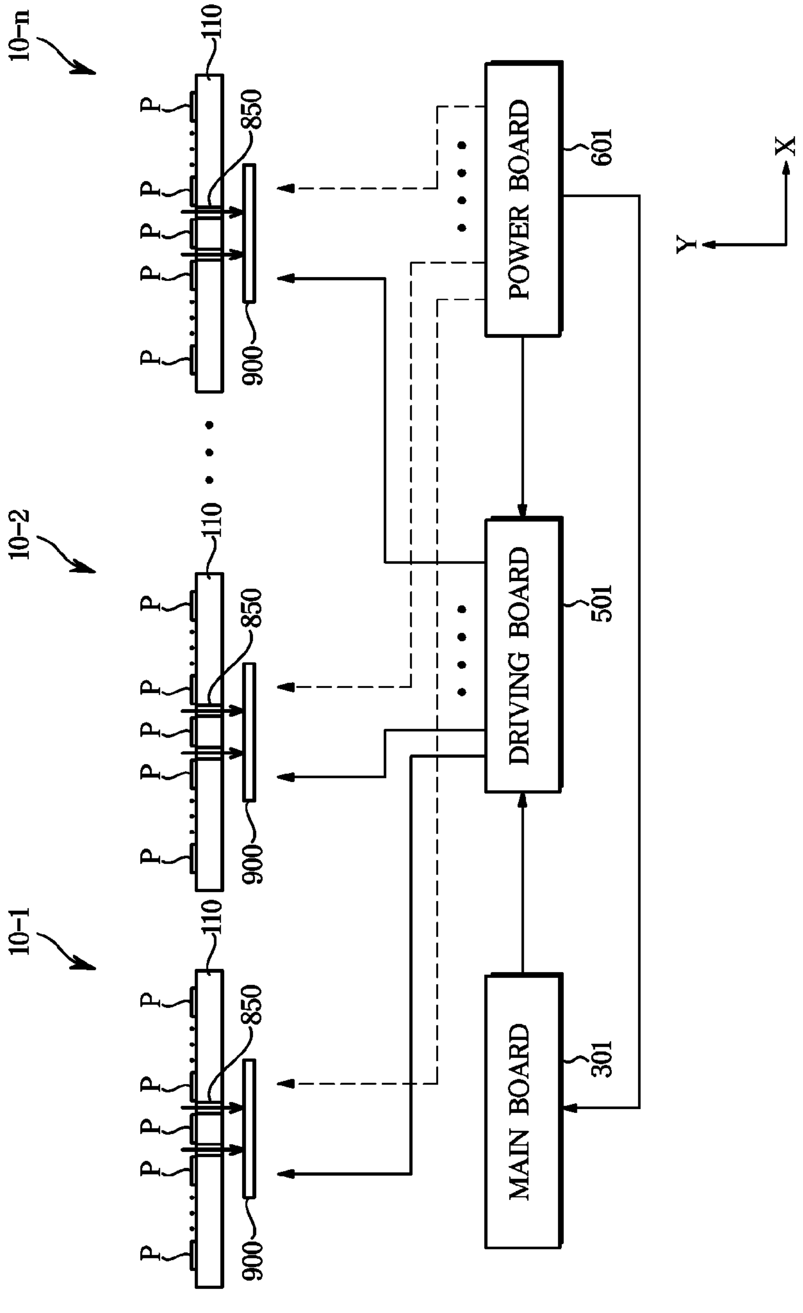

FIGS. 18 and 19 are diagrams illustrating examples of signals that are transmitted to the plurality of tiled display modules 10 in the display device 1 according to an embodiment.

Referring to FIG. 18, the plurality of display modules 10-1, 10-2, . . . , and 10-*n* may be tiled to implement the display device 1 having a large screen. FIGS. 18 and 19 are diagrams illustrating the display device 1 on an XY plane, and thus only illustrate a one-dimensional arrangement of the display modules 10-1, 10-2, . . . , and 10-P, but as described above with reference to FIG. 1, the plurality of display modules 10-1, 10-2, . . . , and 10-*n* may be arranged two-dimensionally.

Referring back to FIG. 12 described above, the display panel 100 may be connected to a FPCB 201 on which the driver IC 200 is mounted. The FPCB 201 may be connected to a driving board 501 to electrically connect the display module 10 to the driving board 501.

The timing controller 500 may be provided on the driving board 501. Accordingly, the driving board 501 may be referred to as a T-con board. The plurality of display modules 10-1, 10-2, . . . , and 10-*n* may receive image data, a timing control signal, and the like from the driving board 501.

Referring to FIG. 19, the display device 1 may further include a main board 301 and a power board 601. The above-described main controller 300 may be provided on the main board 301, and a power supply circuit necessary for supplying power to the plurality of display modules 10-1, 10-2, . . . , and 10-*n* may be provided on the power board 601.

The power board 601 may be electrically connected to the plurality of display modules 10-1, 10-2, . . . , and 10-*n* through the FPCB, and may supply the power voltage VDD, the reference voltage $V_{SS}$, and the like to the plurality of display modules 10-1, 10-2, . . . , and connected through the FPCB.

Although in the above example, the plurality of display modules 10-1, 10-2, . . . , and 10-P shares the driving board 501, each of the display modules 10 may be connected to the separate driving board 501. Alternatively, the plurality of display modules 10-1, 10-2, . . . , and may be grouped, and each of the driving boards 501 may be connected to each group.

Although FIGS. 18 and 19 illustrate that the image sensor 900 is provided in each of the plurality of display modules 10 included in the display device 1, the present disclosure is not limited thereto, and the number of display modules 10 provided with the image sensor 900 is not limited depending on an embodiment such as the image sensor 900 provided in one of the plurality of display modules 10 included in the display device 1.

Figure 20:
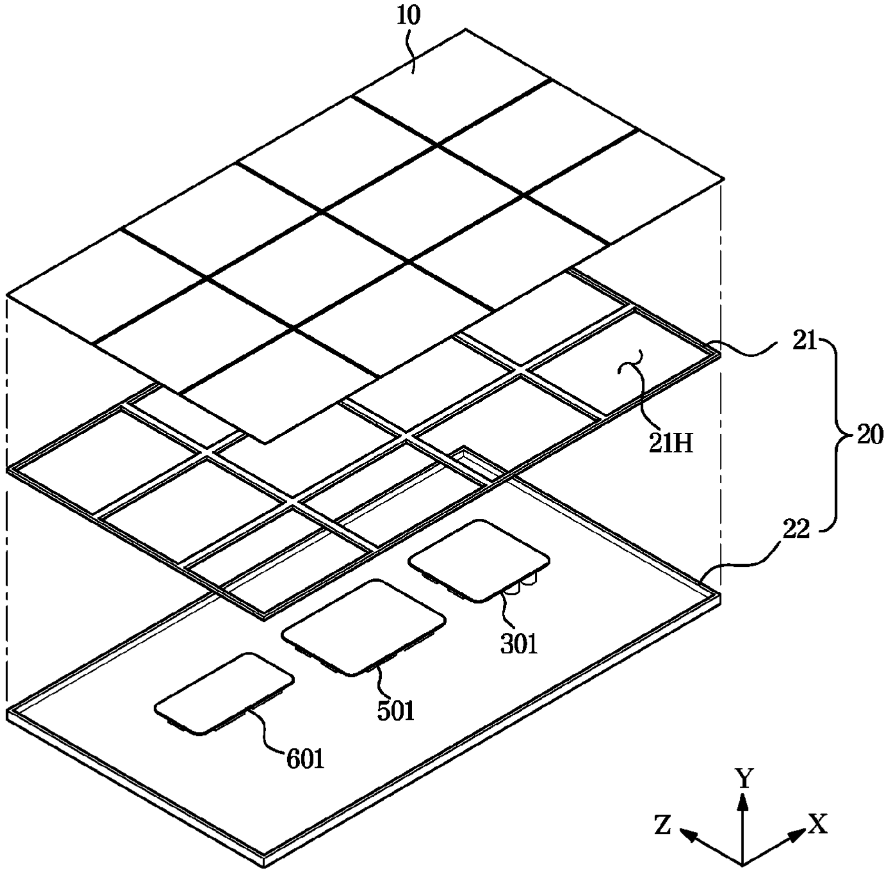
FIG. 20 is a diagram illustrating an example of a manner in which the plurality of display modules is coupled to a housing in the display device according to an embodiment of the present disclosure.

FIG. 20 is a diagram illustrating an example of a manner in which the plurality of the display modules 10 is coupled to a housing in the display device 1 according to an embodiment of the present disclosure.

As described above, the plurality of display modules 10 may be arranged in a two-dimensional matrix form and fixed to the housing 20. Referring to the example of FIG. 20, the plurality of display modules 10 may be installed in a frame 21 positioned thereunder, and the frame 21 may have a two-dimensional mesh structure in which some regions corresponding to the plurality of display modules 10 are open.

Specifically, openings 21H corresponding to the number of display modules 10 may be formed on the frame 21, and the openings 21H may have the same arrangement as that of the plurality of display modules 10.

The plurality of display modules 10 may be mounted on the frame 21 by attachment via a magnetic force of a magnet, by being coupled by a mechanical structure, or by being bonded by an adhesive. However, the method of mounting the display module 10 to the frame 21 is not limited.

The driving board 501, the main board 301 and the power board 601 may be disposed below the frame 21, and may be electrically connected to the plurality of display modules 10 through the openings 21H formed on the frame 21, respectively.

A lower cover 22 is coupled to a lower portion of the frame 21, and the lower cover 22 may form an exterior of a lower surface of the display device 1.

Although the display modules 10 are arranged in two dimensions in the above example, the display modules 10 may be arranged in one dimension, and in this case, the structure of the frame 21 may also be transformed into a one-dimensional mesh structure.

Figure 21:
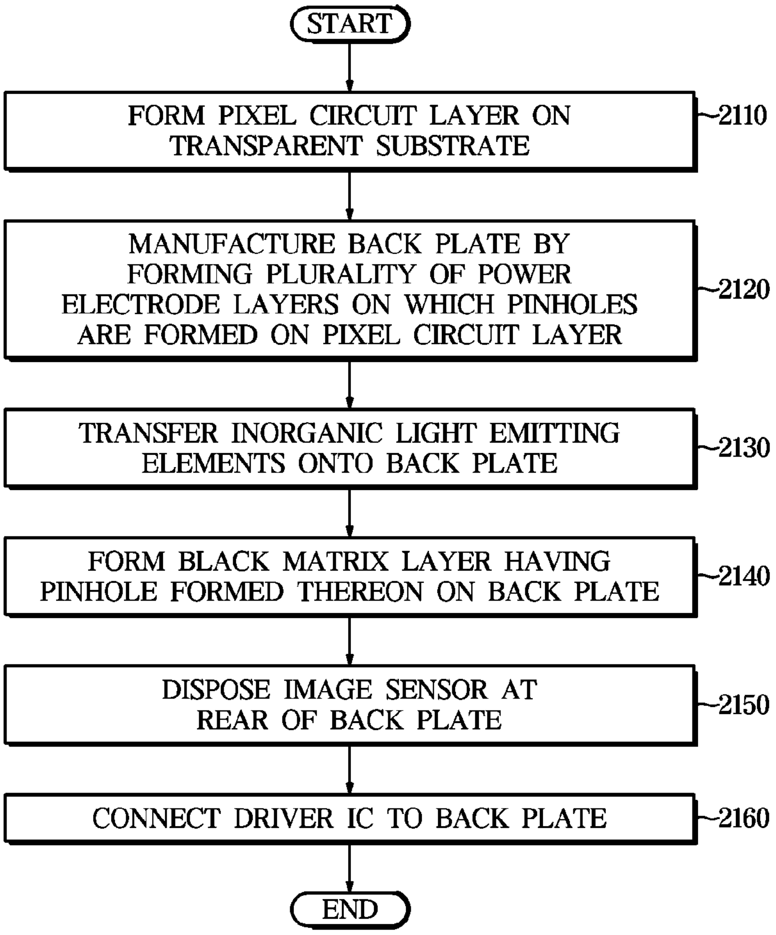
FIG. 21 is a flowchart of a method of manufacturing the display module according to an embodiment of the present disclosure.

FIG. 21 is a flowchart of a method of manufacturing the display module 10 according to an embodiment of the present disclosure.

Referring to FIG. 21, the pixel circuit layer 112 may be formed on the transparent substrate 110*a* in operation 2110.

The transparent substrate 110*a* may be implemented as one of transparent material substrates such as a glass substrate and a silicon substrate.

The pixel circuit layer 112 may be formed on the transparent substrate 110*a*. Specifically, the pixel circuit layer 112 is formed on the upper surface of the transparent substrate 110*a* and may be provided on the upper surface of the buffer layer 111.

As described above, the pixel circuit layer 112 may be provided with the pixel circuit 130, and the pixel circuit 130 may include the thin film transistor 130*a* disposed on the buffer layer 111. The thin film transistor 130*a* may include the active layer 131, the gate electrode 132, the drain electrode 133 and a source electrode 134.

The back plate 110 may be manufactured by forming the plurality of power electrode layers 611, 621, and 631 on which the respective pinholes 851*a*, 851*b*, and 851*c* are formed on the pixel circuit layer 112 in operation 2120.

That is, in the manufacturing process of the display module 10, the respective pinholes 851*a*, 851*b*, and 851*c* in which electrodes are not formed are formed on the power electrode layers 611, 621, and 631 such that the transparent regions 850 are formed.

In addition, the inorganic light emitting elements 120 may be transferred onto the back plate 110 in operation 2130, the black matrix layer 102 having the pinhole 853 formed thereon may be formed on the back plate 110 in operation 2140, and the image sensor 900 may be disposed at the rear of the back plate 110 in operation 2150.

In this case, the transparent region 850 may include the plurality of pinholes 851*a*, 851*b*, and 851*c* formed on the plurality of power electrode layers 611, 621, and 631, respectively, and overlapping in one direction (Y direction).

The transparent region 850 may include the pinhole 853 of the black matrix layer 102 overlapping the respective pinholes 851*a*, 851*b*, and 851*c* of the plurality of power electrode layers 611, 621, and 631 in one direction (Y direction).

That is, the first power electrode layer 611 may include the pinhole 851*a* in which the electrodes are formed, and the second power electrode layer 621 may include the pinhole 851*b* in which the electrodes are not formed at the position corresponding to the pinhole 851*a* of the first power electrode layer 611.

The third power electrode layer 631 may also include the pinhole 851*c* in which the electrodes are not formed at the position corresponding to the pinhole 851*b* of the second power electrode layer 621, and the black matrix layer 102 may include the pinhole 853 in which the black matrix is not formed corresponding to the pinhole 851*c* of the third power electrode layer 631.

Through this, light incident from the front of the display panel 100 may reach the image sensor 900 by sequentially passing through the pinhole 853 of the black matrix layer 102, the pinhole 851*c* of the third power electrode layer 631, the pinhole 851*b* of the second power electrode layer 621, and the pinhole 851*a* of the first power electrode layer 611, which constitute the transparent regions 850.

In this case, the transparent regions 850 may include the regions of the insulating layers 111, 112*a*, 112*b*, 113*a*, 113*b*, 114*a*, 114*b*, 115*a*, 115*b*, 116*a*, and 116*b* overlapping the pinholes 851*a*, 851*b*, 851*c*, and 853 in one direction (Y direction) and the region 852 of the transparent substrate 110*a*. That is, the light incident from the front of the display panel 100 may reach the image sensor 900 by passing through the pinholes 851*a*, 851*b*, 851*c* and 851, which constitute the transparent regions 850, the regions of the insulating layer 111, 112*a*, 112*b*, 113*a*, 113*b*, 114*a*, 114*b*, 115*a*, 115*b*, 116*a* and 116*b*, and the region 852 of the transparent substrate 110*a*.

In addition, the driver IC 200 may be connected to the back plate 110 in operation 2160. Specifically, the FPCB 201 on which the driver IC 200 is mounted may be connected to the back plate 110.

The transparent region 850 may be formed in a region in which the FPCB 201 is not positioned in the Y direction on the back plate 110 to prevent light from not being transferred to the image sensor 900.

A display module and display device according to an embodiment can realize a UDC function while maintaining a resolution by disposing an image sensor on the rear of a back plate and forming transparent regions through which light passes between pixel apertures of the back plate.

The disclosed embodiments may be implemented in the form of a recording medium storing instructions executable by a computer. The instructions may be stored in the form of program code, and when executed by a processor, a program module may be created to perform the operations of the disclosed embodiments. The recording medium may be implemented as a computer-readable recording medium.

The computer-readable recording medium includes any type of recording medium in which instructions readable by the computer are stored. For example, the recording medium may include a read only memory (ROM), a random access memory (RAM), a magnetic tape, a magnetic disk, a flash memory, an optical data storage device, and the like.

The embodiments disclosed with reference to the accompanying drawings have been described above. It will be understood by those skilled in the art that various changes in form and details may be made therein without departing from the spirit and scope of the disclosure as defined by the claims. The disclosed embodiments are illustrative and should not be construed as limiting.

What is claimed is:

1. A display module comprising:
- a plurality of pixels arranged in two dimensions;
- a display panel comprising:
  - a back plate comprising:
    - a transparent substrate;
    - a pixel circuit layer; and
    - a plurality of power electrode layers provided on the transparent substrate; and
  - a plurality of inorganic light emitting elements provided on the back plate; and
- an image sensor provided on the rear of the display panel,
- wherein each of the plurality of pixels comprises two or more inorganic light emitting elements among the plurality of inorganic light emitting elements,
- wherein the display panel comprises a plurality of transparent regions in a region corresponding to a position of the image sensor, and each transparent region of the plurality of transparent regions is configured to allow external light to be incident on the image sensor,
- wherein each transparent region of the plurality of transparent regions is provided between apertures of two or more pixels among the plurality of pixels, and
- wherein each transparent region of the plurality of transparent regions comprises a plurality of pinholes respectively provided in the plurality of power electrode layers and overlapping in a stacking direction of the plurality of power electrode layers.

2. The display module according to claim 1, wherein the display panel further comprises a black matrix layer provided on the back plate and configured to block light in a region other than a region corresponding to an aperture of each of the plurality of pixels, and
- wherein each transparent region of the plurality of transparent regions further comprises a pinhole in the black matrix layer overlapping the pinhole of each of the plurality of power electrode layers in one direction.

3. The display module according to claim 1, wherein each of the plurality of transparent regions is in a region in which a pixel circuit on the pixel circuit layer is not positioned.

4. The display module according to claim 1, wherein each transparent region of the plurality of transparent regions is in a region in which signal wires on the pixel circuit layer are not positioned.

5. The display module according to claim 1, further comprising:
- a driver integrated circuit (IC) configured to transmit a driving signal to a pixel circuit of the pixel circuit layer; and
- a flexible printed circuit board (FPCB) on which the driver IC is provided and electrically connected to a rear surface of the back plate,
- wherein each of the plurality of transparent regions is in a region in which the FPCB is not positioned.

6. The display module according to claim 1, wherein the plurality of transparent regions have substantially the same diameter.

7. The display module according to claim 1, wherein the plurality of transparent regions comprises at least one first transparent region having a first diameter and at least one second transparent region having a second diameter that is different from the first diameter.

8. The display module according to claim 1, wherein the plurality of transparent regions comprises:
- at least one first transparent region having a first diameter;
- at least one second transparent region having a second diameter larger than the first diameter; and
- at least one third transparent region having a third diameter smaller than the first diameter.

9. The display module according to claim 1, wherein the plurality of transparent regions comprises at least one first transparent region having a first diameter and at least one second transparent region having a second diameter that is larger than the first diameter, and
- wherein the at least one first transparent region is provided on the display panel at a first position that is closer to a center of the region corresponding to the position of the image sensor than a second position corresponding to the at least one second transparent region.

10. The display module according to claim 1, wherein the plurality of transparent regions comprises at least one first transparent region having a first diameter and at least one second transparent region having a second diameter that is larger than the first diameter, and
- wherein the at least one second transparent region is provided on the display panel at a first position that is closer to a center of the region corresponding to the position of the image sensor than a second position corresponding to the at least one first transparent region.

11. The display module according to claim 1, wherein each transparent region of the plurality of transparent regions has a diameter that is different from at least one respective adjacent transparent region of the plurality of transparent regions.

12. The display module according to claim 1, wherein the image sensor is configured to obtain image data by detecting external light incident through the plurality of transparent regions.

13. A display device comprising:

a plurality of display modules comprising a plurality of pixels arranged in two dimensions; and a frame configured to support the plurality of display modules, wherein at least one of the plurality of display modules comprises:

a display panel comprising:

a back plate comprising:

a transparent substrate;

a pixel circuit layer; and a plurality of power electrode layers provided on the transparent substrate; and a plurality of inorganic light emitting elements provided on the back plate; and an image sensor provided on the rear of the display panel, wherein each of the plurality of pixels comprises two or more inorganic light emitting elements among the plurality of inorganic light emitting elements, and wherein the display panel comprises a plurality of transparent regions in a region corresponding to a position of the image sensor, and each transparent region of the plurality of transparent regions is configured to allow external light to be incident on the image sensor, wherein each transparent region of the plurality of transparent regions is provided between apertures of two or more pixels among the plurality of pixels, and wherein each transparent region of the plurality of transparent regions comprises a plurality of pinholes respectively provided in the plurality of power electrode layers and overlapping in a stacking direction of the plurality of power electrode layers.

14. The display device according to claim 13, wherein the display panel further comprises a black matrix layer provided on the back plate and configured to block light in a region other than a region corresponding to an aperture of each of the plurality of pixels, and wherein each transparent region of the plurality of transparent regions comprises a pinhole in the black matrix layer overlapping the pinhole of each of the plurality of power electrode layers in one direction.

15. The display device according to claim 13, wherein each transparent region of the plurality of transparent regions is in a region in which a pixel circuit on the pixel circuit layer is not positioned.

* * * * *